United States Patent
Schreyer et al.

(10) Patent No.: US 12,107,552 B2
(45) Date of Patent: Oct. 1, 2024

(54) POWER AMPLIFIER MANAGEMENT

(71) Applicant: QUALCOMM Incorporated, San Diego, CA (US)

(72) Inventors: Earl Schreyer, Raleigh, NC (US); Sherif Galal, Irvine, CA (US); Sang-Uk Ryu, San Diego, CA (US); Hui-ya Liao Nelson, San Diego, CA (US); Subbarao Surendra Chakkirala, San Jose, CA (US); Shreyas Srikanth Payal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 571 days.

(21) Appl. No.: 17/448,244

(22) Filed: Sep. 21, 2021

(65) Prior Publication Data
US 2023/0108378 A1    Apr. 6, 2023

(51) Int. Cl.
G06K 7/10    (2006.01)
H03F 1/02    (2006.01)
H03F 3/24    (2006.01)

(52) U.S. Cl.
CPC ........... *H03F 1/0227* (2013.01); *H03F 3/245* (2013.01); *H03F 2200/03* (2013.01); *H03F 2200/462* (2013.01); *H03F 2200/468* (2013.01)

(58) Field of Classification Search
CPC .................................. G06K 7/10; G06K 19/07
USPC ......................................................... 330/278
See application file for complete search history.

(56) References Cited

U.S. PATENT DOCUMENTS

| 8,917,163 | B2 * | 12/2014 | Ku ...................... G06K 19/073 235/382 |
| 2008/0123873 | A1 | 5/2008 | Bjorn-Josefsen et al. |
| 2014/0159871 | A1 * | 6/2014 | Ku ...................... G06K 19/073 235/492 |
| 2015/0270813 | A1 * | 9/2015 | Morshedi ............. H04B 1/0458 455/144 |

(Continued)

FOREIGN PATENT DOCUMENTS

CN    110768632 A    2/2020

OTHER PUBLICATIONS

International Search Report and Written Opinion—PCT/US2022/074511—ISA/EPO—Nov. 22, 2022.

*Primary Examiner* — Henry Choe
(74) *Attorney, Agent, or Firm* — QUALCOMM Incorporated; Espartaco Diaz Hidalgo

(57) ABSTRACT

A method includes receiving first data associated with a first power amplifier and second data associated with a second power amplifier. The method also includes generating a first amplitude limiting signal having gain parameters that are based on the first data and the second data. The first data includes at least one of a temperature measurement associated with the first power amplifier, a supply voltage measurement associated with the first power amplifier, a load resistance associated with the first power amplifier, or a gain associated with the first power amplifier. The method further includes modifying an audio signal based at least in part on the first amplitude limiting signal to generate a first gain-adjusted audio signal. The method also includes providing a first output audio signal to the first power amplifier for amplification. The first output audio signal is based at least in part on the first gain-adjusted audio signal.

23 Claims, 12 Drawing Sheets

(56) References Cited

U.S. PATENT DOCUMENTS

2016/0329867 A1 11/2016 Lesso et al.

* cited by examiner

POWER AMPLIFIER MANAGEMENT

I. FIELD

The present disclosure is generally related to power amplifiers.

II. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Mobile devices, such as mobile phones, can include one or more power amplifiers that are operable to amplify audio signals. As a non-limiting example, a power amplifier can reproduce audio that is played out at a loudspeaker of a mobile device. In some instances, the power amplifier may not be able to reproduce high-fidelity audio at regular operating conditions due to line-loss in battery leads, a junction temperature of the power amplifier, etc. For example, if a battery level associated with the power amplifier has a relatively high variance, the power amplifier may not be able to provide a distortion-free audio output. As another example, if the junction temperature associated with the power amplifier has a relatively high variance, the power amplifier may not be able to provide a distortion-free audio output. If the mobile device includes multiple power amplifiers, it can become increasingly difficult to manage outputs of each power amplifier, as each power amplifier can have a different battery level, a different junction temperature, etc.

III. SUMMARY

According to one implementation of the present disclosure, a device includes a memory and one or more processors coupled to the memory. The one or more processors are configured to receive first data associated with a first power amplifier and second data associated with a second power amplifier. The one or more processors are also configured to generate a first amplitude limiting signal having gain parameters that are based on the first data and the second data. The first data includes at least one of a temperature measurement associated with the first power amplifier, a supply voltage measurement associated with the first power amplifier, a load resistance associated with the first power amplifier, or a gain associated with the first power amplifier. The one or more processors are further configured to modify an audio signal based at least in part on the first amplitude limiting signal to generate a first gain-adjusted audio signal. The one or more processors are also configured to provide a first output audio signal to the first power amplifier for amplification. The first output audio signal is based at least in part on the first gain-adjusted audio signal.

According to another implementation of the present disclosure, a method of managing power amplifiers includes receiving, at a processor, first data associated with a first power amplifier and second data associated with a second power amplifier. The method also includes generating, at the processor, a first amplitude limiting signal having gain parameters that are based on the first data and the second data. The first data includes at least one of a temperature measurement associated with the first power amplifier, a supply voltage measurement associated with the first power amplifier, a load resistance associated with the first power amplifier, or a gain associated with the first power amplifier. The method further includes modifying, at the processor, an audio signal based at least in part on the first amplitude limiting signal to generate a first gain-adjusted audio signal. The method also includes providing a first output audio signal to the first power amplifier for amplification. The first output audio signal is based at least in part on the first gain-adjusted audio signal.

According to another implementation of the present disclosure, a non-transitory computer-readable medium includes instructions that, when executed by one or more processors of a device, cause the one or more processors to receive first data associated with a first power amplifier and second data associated with a second power amplifier. The instructions, when executed by the one or more processors, also cause the one or more processors to generate a first amplitude limiting signal having gain parameters that are based on the first data and the second data. The first data includes at least one of a temperature measurement associated with a first power amplifier, a supply voltage measurement, a load resistance associated with the first power amplifier, or a gain associated with the first power amplifier. The instructions, when executed by the one or more processors, further cause the one or more processors to modify an audio signal based at least in part on the first amplitude limiting signal to generate a first gain-adjusted audio signal. The instructions, when executed by the one or more processors, also cause the one or more processors to provide a first output audio signal to the first power amplifier for amplification. The first output audio signal is based at least in part on the first gain-adjusted audio signal.

According to another implementation of the present disclosure, an apparatus includes means for receiving first data associated with a first power amplifier and second data associated with a second power amplifier. The apparatus also includes means for generating a first amplitude limiting signal having gain parameters that are based on the first data and the second data. The first data includes at least one of a temperature measurement associated with a first power amplifier, a supply voltage measurement, a load resistance associated with the first power amplifier, or a gain associated with the first power amplifier. The apparatus also includes means for modifying an audio signal based at least in part on the first amplitude limiting signal to generate a first gain-adjusted audio signal. The apparatus further includes means for providing a first output audio signal to the first power amplifier for amplification. The first output audio signal is based at least in part on the first gain-adjusted audio signal.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1A:
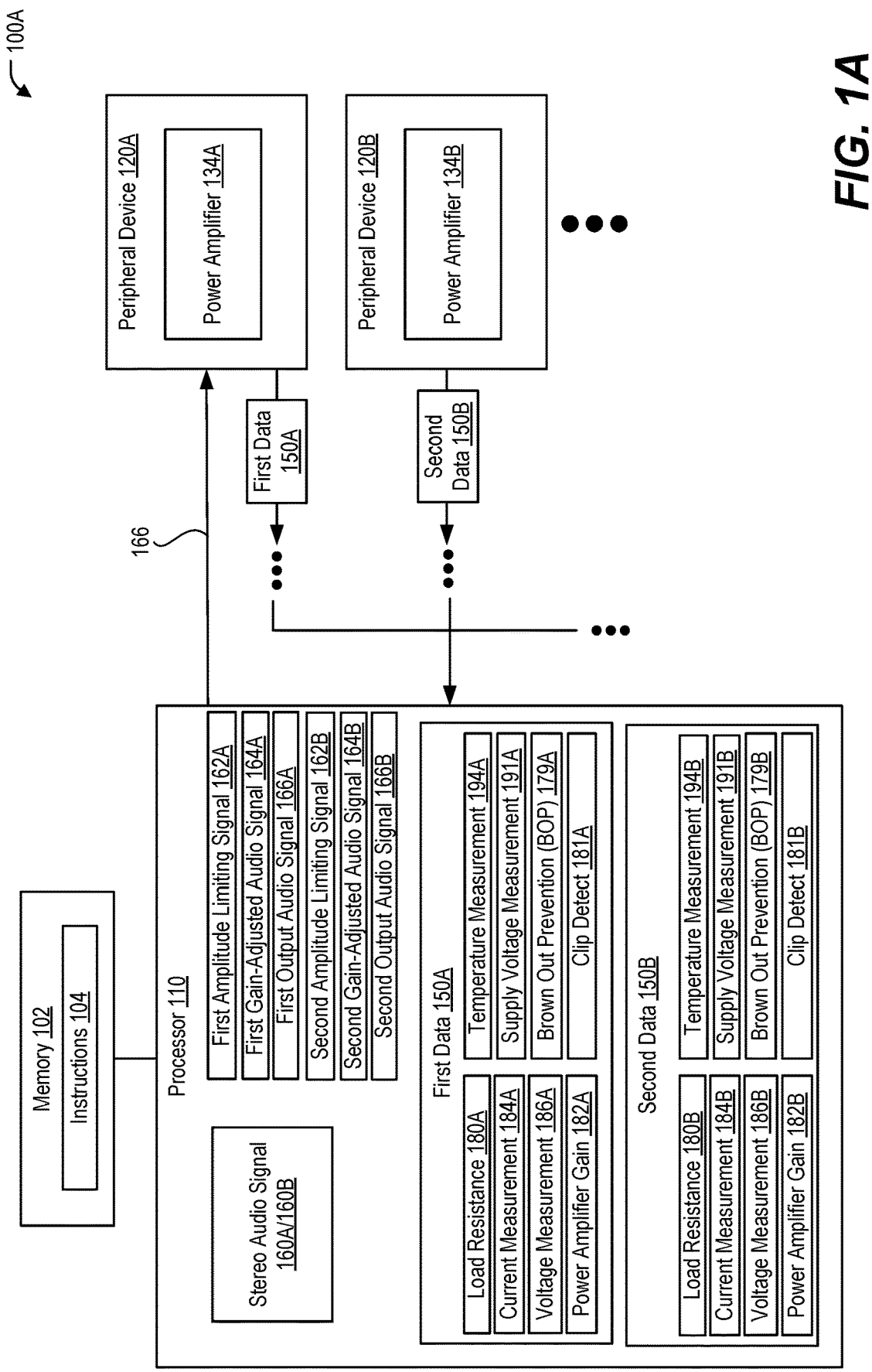
FIG. 1A is a block diagram of a particular illustrative aspect of a system configured to manage multiple power amplifiers using a centralized platform, in accordance with some examples of the present disclosure.

Systems and methods of managing one or more power amplifiers using a centralized platform are disclosed. For example, a mobile device can include a processor, such as a central processing unit (CPU) or a digital processing unit (DSP), that is coupled to a plurality of peripheral devices. As a non-limiting example, the processor can correspond to a centralized platform that is coupled to a first peripheral device and a second peripheral device. The first peripheral device can include a first power amplifier configured to reproduce first audio based on a first audio signal from the processor, and the second peripheral device can include a second power amplifier configured to reproduce second audio based on a second audio signal from the processor. According to the techniques described herein, the processor can improve audio output by managing an amount of distortion (e.g., total harmonic distortion) at each power amplifier based on feedback data collected from the corresponding peripheral devices. For example, the processor can include a feedback-controlled amplitude limiter for audio signals provided to the peripheral devices.

To illustrate, the processor can receive first feedback data from the first peripheral device and second feedback data from the second peripheral device. The first feedback data can include a first supply voltage measurement associated with the first power amplifier, a first junction temperature associated with the first power amplifier, and a first load resistance associated with the first power amplifier (e.g., audio clip data). The audio clip data can be determined based on a measured current and voltage (IV) of an output signal from the first power amplifier. In a similar manner, the second feedback data can include a second supply voltage measurement associated with the second power amplifier, a second junction temperature associated with the second power amplifier, and a second load resistance associated with the second power amplifier.

Based on the feedback data from the peripheral devices, the processor can generate amplitude limiting signals or "attenuation signals" to control the gain of the audio signals provided to the peripheral devices. As a non-limiting example, the processor can perform table look-up operations using the feedback data to determine target gains for each power amplifier to reduce distortion at the power amplifiers. Amplitude limiting signals can be generated by the processor based on a difference between the target gains and power amplifier gains (e.g., "maximum" gains) for each power amplifier. The audio signals provided to each power amplifier can be attenuated based on the amplitude limiting signals such that distortion at the power amplifiers is reduced and high-fidelity audio is produced.

Additionally, the centralized control techniques described herein enable the processor to aggregate system power to limit overall power consumption. As a non-limiting example, the processor can monitor a battery level of the mobile device and adjust operations of each power amplifier based on the battery level. Because operation of the power amplifiers is centrally managed at the processor (as opposed to managed at the individual peripheral devices), the processor can identify system power consumption targets and adjust operations at each power amplifier or peripheral device to ensure that the system power consumption targets are achieved.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. To illustrate, FIG. 1A depicts a system 100A including one or more processors ("processor(s)" 110 of FIG. 1), which indicates that in some implementations the system 100A includes a single processor 110 and in other implementations the system 100A includes multiple processors 110. For ease of reference herein, such features are generally introduced as "one or more" features and are subsequently referred to in the singular unless aspects related to multiple of the features are being described.

It may be further understood that the terms "comprise," "comprises," and "comprising" may be used interchangeably with "include," "includes," or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

As used herein, "coupled" may include "communicatively coupled," "electrically coupled," or "physically coupled," and may also (or alternatively) include any combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive signals (e.g., digital signals or analog signals) directly or indirectly, via one or more wires, buses, networks, etc. As used herein, "directly coupled" may include two devices that are coupled (e.g., communicatively coupled, electrically coupled, or physically coupled) without intervening components.

In the present disclosure, terms such as "determining," "calculating," "estimating," "shifting," "adjusting," etc. may be used to describe how one or more operations are performed. It should be noted that such terms are not to be construed as limiting and other techniques may be utilized to perform similar operations. Additionally, as referred to herein, "generating," "calculating," "estimating," "using," "selecting," "accessing," and "determining" may be used interchangeably. For example, "generating," "calculating," "estimating," or "determining" a parameter (or a signal) may refer to actively generating, estimating, calculating, or determining the parameter (or the signal) or may refer to using, selecting, or accessing the parameter (or signal) that is already generated, such as by another component or device.

Particular implementations are described herein with reference to the drawings. In the description, common features are designated by common reference numbers throughout the drawings. In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 1A, power amplifiers are illustrated and associated with reference numbers 134A and 134B. When referring to a particular one of these power amplifiers, such as the power amplifier 134A, the distinguishing letter "A" is used. However, when referring to any arbitrary one of these power amplifiers or to these power amplifiers as a group, the reference number 134 is used without a distinguishing letter Referring to FIG. 1, a particular illustrative aspect of a system configured to manage multiple power amplifiers using a centralized platform is disclosed and generally designated 100A. The system 100 includes a memory 102, one or more processors 110, a peripheral device 120A, and a peripheral device 120B. The memory 102, the one or more processors 110, and the peripheral devices 120A, 120B can be integrated into a mobile device, such as a mobile phone. The one or more processors 110 can include a central processing unit (CPU), a digital signal processor (DSP), etc. The peripheral device 120A can include a power amplifier 134A that is configured to amplify audio signals from the one or more processors 110 for playback, and the peripheral device 120B can include a power amplifier 134B that is configured to amplify audio signals from the one or more processors 110 for playback. Although two peripheral devices 120 are illustrated, in other implementations, the system 100A can include additional peripheral devices. As a non-limiting example, the system 100A can include four (4) peripheral devices.

The one or more processors 110 are configured to manage the power amplifiers 134A, 134B based on feedback associated with the power amplifiers 134A, 134B. For example, the one or more processors 110 can be configured to receive first data 150A associated with the power amplifier 134A and second data 150B associated with the power amplifier 134B. According to one implementation, the first data 150A can correspond to a first data stream or a first data packet, and the second data 150B can correspond to a second data stream or a second data packet. Based on the feedback (e.g., the first data 150A and the second data 150B), the one or more processors 110 can adjust a gain of an audio signal 160 provided to the power amplifiers 134A, 134B.

The first data 150A can include at least one of a temperature measurement 194A associated with the power amplifier 134A, a supply voltage measurement 191A associated with the power amplifier 134A, a load resistance 180A associated with the power amplifier 134A, a gain 182A associated with the power amplifier 134A, brown out prevention (BOP) data 179A, or clip detection data 181A. As described in greater detail with respect to FIG. 1B, the load resistance 180A can be based on a current measurement 184A and a voltage measurement 186A associated with an amplified signal of the power amplifier 134A. Thus, according to some implementations, the load resistance 180A can correspond to a load resistance of a speaker or haptic device coupled to an output of the power amplifier 134A. The BOP data 179A can indicate a likelihood of a brownout event based on the above sensed and measured properties. The clip detection data 181A can indicate the likelihood of audio clipping based on the above sensed and measured properties. The second data 150B can include at least one of a temperature measurement 194B associated with the power amplifier 134B, a supply voltage measurement 191B associated with the power amplifier 134B, a load resistance 180B associated with the power amplifier 134B, a gain 182B associated with the power amplifier 134B, BOP data 179B, or clip detection data 181B. In a similar manner as described above, the load resistance 180B can be based on a current measurement 184B and a voltage measurement 186B associated with an amplified signal of the power amplifier 134B.

For each power amplifier 134A, 134B, the one or more processors 110 can perform a table look-up operation based on the temperature measurement 194A, 194B, the supply voltage measurement 191A, 191B, the load resistance 180A, 180B, or a combination thereof to determine a target gain for the respective power amplifier 134A, 134B. Based on a difference between the respective power amplifier gains 182A, 182B and the target gains, the one or more processors 110 can determine gain parameters for signal attenuation. For example, based on a difference between the power amplifier gain 182A and the target gain for the power amplifier 134A, the one or more processors 110 can determine gain parameters for a first amplitude limiting signal 162A. As described in greater detail with respect to FIG. 1B, the first amplitude limiting signal 162A can be used to modify the audio signal 160 to generate a first gain-adjusted audio signal 164A. The one or more processors 110 can perform an analog-to-digital conversion operation on the first gain-adjusted audio signal 164A to generate a first output audio signal 166A that is provided to the peripheral device 120A (e.g., the power amplifier 134A). Thus, the one or more processors 110 can generate gain parameters based on the difference between the gain 182A of the power amplifier 134A and the target gain. Using the gain parameters, the one or more processors 110 can attenuate the audio signal 160 such that the attenuation of the audio signal 160 compensates for the difference between the gain 182A of the power amplifier 134A and the target gain 195A.

The techniques described with respect to FIG. 1A enable a centralized platform, such as the processor 110, to attenuate audio signals provided to the peripheral devices 120A, 120B (based on operating conditions of the peripheral devices 120A, 120B) to ensure that the peripheral devices 120A, 120B produce high-fidelity output audio. For example, based on feedback (e.g., the load resistances 180A, 180B, the supply voltage measurements 191A, 191B, and the temperature measurements 194A, 194B), the centralized platform can determine the target gain for each power amplifier 134A, 134B that would likely result in a high-fidelity output audio. The centralized platform can generate gain parameters based on the difference between the gain 182A, 182B of the respective power amplifier 134A, 134B and the corresponding target gains. Using the gain parameters, the centralized platform can attenuate the audio signal 160 such that the attenuation of the audio signal 160 compensates for the difference between the gains 182A, 183B of the power amplifiers 134A, 134B and the target gains.

Figure 1B:
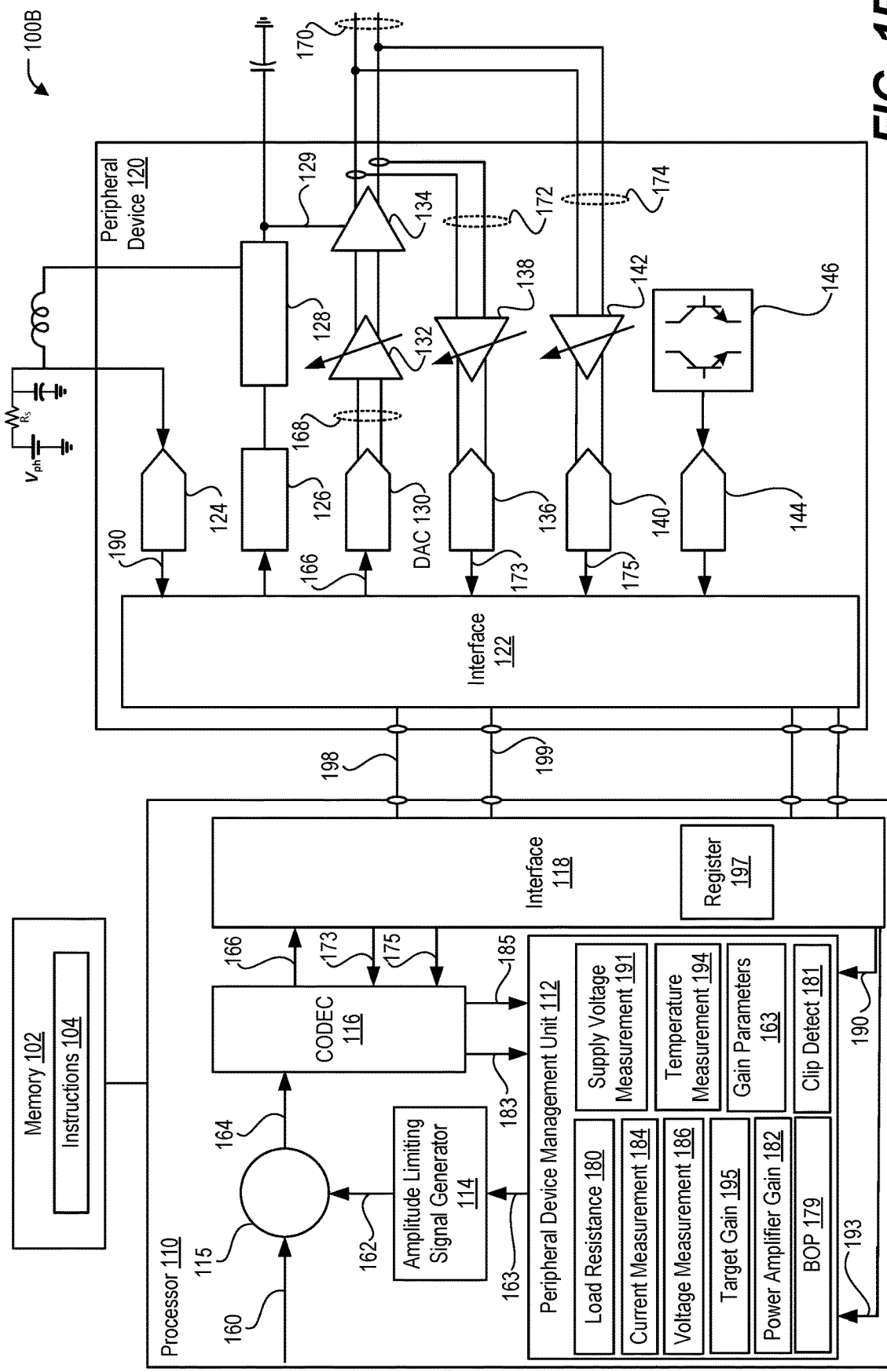
FIG. 1B is a block diagram of a particular illustrative aspect of a system configured to generate high-fidelity audio at different operating conditions using a centralized platform, in accordance with some examples of the present disclosure.

Referring to FIG. 1B, a particular illustrative aspect of a system configured to generate high-fidelity audio at different operating conditions using a centralized platform is disclosed and generally designated 100B. The system 100B includes the memory 102, the one or more processors 110, and a peripheral device 120. The memory 102, the one or more processors 110, and the peripheral device 120 can be integrated into a mobile device, such as a mobile phone. The one or more processors 110 can include a central processing unit (CPU), a digital signal processor (DSP), etc. The peripheral device 120 can include a power amplifier 134 that is configured to amplify audio signals from the one or more processors 110 for playback. The peripheral device 120 can correspond to the peripheral device 120A of FIG. 1A or the peripheral device 120B of FIG. 1A.

The one or more processors 110 include a peripheral device management unit 112, an amplitude limiting signal generator 114, a combiner 115, a coder/decoder (CODEC) 116, and an interface 118. According to one implementation, one or more of the components of the one or more processors 110 can be implemented using dedicated circuitry. As non-limiting examples, one or more of the components of the one or more processors 110 can be implemented using a field programmable gate array (FPGA), an application-specific integrated circuit (ASIC), etc. According to another implementation, one or more of the components of the one or more processors 110 can be implemented by executing instructions 104 stored in the memory 102. For example, the memory 102 can be a non-transitory computer-readable medium that stores instructions 104 executable by the one or more processors 110 to perform the operations described herein.

The peripheral device 120 includes an interface 122, a supply voltage analog-to-digital converter (ADC) 124 a controller 126, a boost switcher 128, a digital-to-analog converter (DAC) 130, a control amplifier circuit 132, a power amplifier 134, an output current ADC 136, a control amplifier circuit 138, an output voltage ADC 140, a control amplifier circuit 142, and a temperature ADC 144. According to one implementation, the peripheral device includes a semiconductor circuit 146 (e.g., a chip) that integrates the other components of the peripheral device 120. For example, at least one of the interface 122, the supply voltage ADC 124, the controller 126, the boost switcher 128, the DAC 130, the control amplifier circuit 132, the power amplifier 134, the output current ADC 136, the control amplifier circuit 138, the output voltage ADC 140, the control amplifier circuit 142, or the temperature ADC 144 can be integrated into the semiconductor circuit 146.

In some implementations, the peripheral device 120 can include fewer components. In other implementations, the peripheral device 120 can include additional components. According to some implementations, one or more of the components of the peripheral device 120 can be combined. As a non-limiting example, in some implementations, the supply voltage ADC 124, the output current ADC 136, the output voltage ADC 140, and the temperature ADC 144 can be combined into a single component.

The power amplifier 134 of the peripheral device 120 can be used to produce an audio output by amplifying audio signals from the processor 110 for playback. To illustrate, the processor 110 can use the interface 118 to send an output audio signal 166 to the peripheral device 120 via a data line 198 and a clock line 199. The interface 122 of the peripheral device 120 can be configured to receive the output audio signal 166 and provide the output audio signal 166 to the DAC 130. The DAC 130 can be configured to perform a digital-to-analog conversion operation on the output audio signal 166 to generate an analog signal 168. According to the example of FIG. 1B, the analog signal 168 is a differential signal. However, in other implementations, the analog signal 168 can be a single-ended signal. The analog signal 168 is provided to the power amplifier 134. In some scenarios, the control amplifier circuit 132 can amplify the analog signal 168 prior to providing the analog signal 168 to the power amplifier 134. The power amplifier 134 can be configured to amplify the analog signal 168 to generate an amplified signal 170 that is provided to one or more speakers (not shown) for audio playback.

In some scenarios, properties of the amplified signal 170, such as a gain associated with the amplified signal 170, may not result in a high-fidelity audio output from the speakers. For example, if an available supply voltage ($V_{ph}$) at the peripheral device 120 has a relatively high variance, the power amplifier 134 may not be able to generate an amplified signal 170 that results in a distortion-free audio output. To illustrate, the controller 126 and the boost switcher 128 can convert the available supply voltage ($V_{ph}$) at the peripheral device 120 to a supply voltage 129 for the power amplifier 134. However, the available supply voltage ($V_{ph}$) may decrease as a result of current-resistance (IR) losses associated with an increase in a resistance ($R_s$) over time and a relatively large current draw. A decrease in the available supply voltage ($V_{ph}$) may result in a decrease to the supply voltage 129 provided to the amplifier 134. As a result of decrease to the supply voltage 129, the power amplifier 134 may generate an audio output that is subject to a relatively high degree of distortion. As another example, if a junction temperature associated with the power amplifier 134 has a relatively high variance, the power amplifier 134 may not be able to generate an amplified signal 170 that results in a distortion-free audio output.

To circumvent the above concerns, the processor 110 can use feedback from the peripheral device 120 to control a gain of the output audio signal 166, and as a result, reduce an amount of distortion (e.g., total harmonic distortion) at the power amplifier 134 to produce a high-fidelity output. As described below, the processor 110 can use characteristics of the amplified signal 170 (e.g., voltage and current measurements associated with the amplified signal 170) and other feedback information from the peripheral device 120 to control the gain of the output audio signal 166. For example, as described below, the processor 110 can control the gain of the output audio signal 166 based on a load resistance 180 associated with the power amplifier 134, a supply voltage measurement 191 associated with the power amplifier 134, a temperature measurement 194 associated with the power amplifier 134, a gain 182 associated with the power amplifier 134, or a combination thereof. As used herein, the load resistance 180 associated with the power amplifier 134 can correspond to a resistance of a load, such as a load resistance of a speaker (e.g., the speaker 1492A of FIG. 14 or the speaker 1492B of FIG. 14), coupled to receive an output of the power amplifier 134.

To determine the load resistance 180 associated with the power amplifier 134, and thus to control the gain of the output audio signal 166 based on the load resistance 180, the processor 110 can be configured to determine a current measurement 184 and a voltage measurement 186 associated with the amplified signal 170 of the power amplifier 134. As described below, the current and voltage measurements 184, 186 can be determined based on audio clip data that is generated by sampling the output of the power amplifier 134.

To determine the current and voltage measurements 184, 186, the amplified signal 170 of the power amplifier 134 can be tapped to generate a current signal 172 that is provided to the output current ADC 136. According to some implementations, the control amplifier circuit 138 can amplify the current signal 172 prior to providing the current signal 172 to the output current ADC 136. The output current ADC 136 can perform an analog-to-digital conversion operation on the current signal 172 to generate a digital current signal 173.

Additionally, the amplified signal 170 of the power amplifier 134 can be tapped to generate a voltage signal 174 that is provided to the output voltage ADC 140. According to some implementations, the control amplifier circuit 142 can amplify the voltage signal 174 prior to providing the voltage signal 174 to the output voltage ADC 140. The output voltage ADC 140 can perform an analog-to-digital conversion operation on the voltage signal 174 to generate a digital voltage signal 175.

The interface 122 of the peripheral device 120 can provide the digital current and voltage signals 173, 175 to the processor 110 via the data and clock lines 198, 199. The interface 118 of the processor 110 can receive the digital current and voltage signals 173, 175 and provide the digital current and voltage signals 173, 175 to the CODEC 116. The CODEC 116 can be configured to perform a digital-to-analog conversion operation on the digital current signal 173 to generate an analog current signal 183 that is substantially similar to the current signal 172. Additionally, the CODEC 116 can be configured to perform a digital-to-analog conversion operation on the digital voltage signal 175 to generate an analog voltage signal 185 that is substantially similar to the voltage signal 174. The analog current and voltage signals 183, 185 are provided to the peripheral device management unit 112. The peripheral device management unit 112 can determine the current measurement 184 based on the analog current signal 183 and can determine the voltage measurement 186 based on the analog voltage signal 185.

Based on the voltage and current measurements 184, 186, the peripheral device management unit 112 can be configured to determine the load resistance 180 associated with the load connected to the power amplifier 134. For example, the peripheral device management unit 112 can determine the load resistance 180 associated with the power amplifier 134 by determining the quotient of the current and voltage measurements 184, 186. As described below with respect to FIG. 2, the load resistance 180 can be used by the gain parameter determination unit 206 to determine gain parameters 163, which in turn, are used to control the gain of the output audio signal 166 and manage distortion at the power amplifier 134.

To determine the supply voltage measurement 191 associated with the power amplifier 134, and thus to control the gain of the output audio signal 166 based on the supply voltage measurement 191, the processor 110 can be configured to receive feedback data from the peripheral device 120 indicating the available supply voltage ($V_{ph}$) of the peripheral device 120. According to one implementation, the available supply voltage ($V_{ph}$) of the peripheral device 120 can be a fixed supply voltage for a system the operates independent of battery power. According to another implementation, the available supply voltage ($V_{ph}$) of the peripheral device 120 can be a battery voltage level. The available supply voltage ($V_{ph}$) can be tapped and provided to the supply voltage ADC 124. The supply voltage ADC 124 can be configured to perform an analog-to-digital conversion operation on the tapped voltage signal to generate a digital voltage signal 190 that indicates a voltage level associated with the available supply voltage ($V_{ph}$). The interface 122 of the peripheral device 120 can provide the digital voltage signal 190 to the processor 110 via the data and clock lines 198, 199. The interface 118 of the processor 110 can receive the digital voltage signal 190 and provide the digital voltage signal 190 to the peripheral device management unit 112.

The peripheral device management unit 112 can be configured to determine the supply voltage measurement 191 associated with the power amplifier 134. According to one implementation, the peripheral device management unit 112 can determine the supply voltage measurement 191 based on the digital voltage signal 190. For example, the peripheral device management unit 112 can determine a voltage level of the digital voltage signal 190 to determine the supply voltage measurement 191. According to some implementations, the supply voltage measurement 191 can be determined and stored in a register 197. According to another implementation, the peripheral device management unit 112 can determine the supply voltage measurement 191 based on a received input stream (e.g., voltage and current signals). As described below, the supply voltage measurement 191 can be used by the peripheral device management unit 112 to determine the gain parameters 163, which in turn, are used to control the gain of the output audio signal 166 and manage distortion at the power amplifier 134.

To determine the temperature measurement 194 associated with the power amplifier 134, and thus to control the gain of the output audio signal 166 based on the temperature measurement 194, the processor 110 can be configured to receive feedback data from the peripheral device 120 indicating a junction temperature (e.g., a transistor junction temperature) of the semiconductor circuit 146 associated with the power amplifier 134. To illustrate, the power amplifier 134 can be integrated into the semiconductor circuit 146. The junction temperature can be based on a thermal resistance of the semiconductor circuit 146 and an ambient temperature. The temperature measurement 194 can be determined using the interface 122 based on a read operation associated with the register 197. For example, the register 197 can store information indicating the junction temperature. The interface 122 of the peripheral device 120 can provide the temperature data to the processor 110 via the data and clock lines 198, 199. The interface 118 of the processor 110 can receive the temperature data and provide the temperature data to the peripheral device management unit 112.

The peripheral device management unit 112 can be configured to determine the temperature measurement 194 associated with the power amplifier 134. According to one implementation, the peripheral device management unit 112 can determine the temperature measurement 194 based on the digital signal 193. To illustrate, the peripheral device management unit 112 can use a sensor reading from a sensor (not shown) to determine an ambient temperature, and the temperature measurement 194 (e.g., the junction temperature) can be determined by the peripheral device management unit 112 based on the thermal resistance of the semiconductor circuit 146 and the ambient temperature. According to some implementations, the temperature measurement 194 can be determined and stored in the register 197. According to another implementation, the peripheral device management unit 112 can determine the temperature measurement 194 based on a received input stream (e.g., voltage and current signals). As described below, the temperature measurement 194 can be used by the peripheral device management unit 112 to determine the gain parameters 163, which in turn, are used to control the gain of the output audio signal 166 and manage distortion at the power amplifier 134.

The peripheral device management unit 112 can be configured to perform a table look-up operation based on at least one of the temperature measurement 194, the supply voltage measurement 191, or the load resistance 180 to determine a target gain 195 for the power amplifier 134. Thus, as described in greater detail with respect to FIG. 2, the peripheral device management unit 112 can query a look-up table based on the temperature measurement 194, the supply voltage measurement 191, the load resistance 180, or a combination thereof, to determine the target gain 195 of the power amplifier 134 that would result in a reduced amount of distortion at the power amplifier 134 at the current operating conditions. The peripheral device management unit 112 can further be configured to determine a difference between the gain 182 associated with the power amplifier 134 (e.g., the maximum gain) and the target gain 195 to determine the gain parameters 163.

The gain parameters 163 based on the difference can indicate how to attenuate audio provided to peripheral device 120. For example, the amplitude limiting signal generator 114 can be configured to generate an amplitude limiting signal 162 having the gain parameters 163. An audio signal 160 and the amplitude limiting signal 162 are provided to the combiner 115. The combiner 115 can be configured to modify (e.g., attenuate) the audio signal 160 based at least in part on the amplitude limiting signal 162 to generate a gain-adjusted audio signal 164. Alternatively, an amplitude of the gain-adjusted audio signal 164 can be modified based on the amplifier gain 182. The gain-adjusted audio signal 164 can be provided to the CODEC 116, and the CODEC 116 can be configured to perform a digital-to-analog conversion operation on the gain-adjusted audio signal 164 to generate an updated version of the output audio signal 166. According to one implementation, the feedback-controlled gains described with respect to FIG. 1B can be updated at a rate of approximately one kilohertz (kHz).

The techniques described with respect to FIG. 1B enable a centralized platform, such as the processor 110, to attenuate audio signals provided to the peripheral device 120 (based on operating conditions of the peripheral device 120) to ensure that the peripheral device 120 produces high-fidelity output audio. For example, based on feedback (e.g., the load resistance 180, the supply voltage measurement 191, and the temperature measurement 194), the centralized platform can determine the target gain 195 for the power amplifier 134 that would likely result in a high-fidelity output audio. The centralized platform can generate gain parameters 163 based on the difference between the gain 182 of the power amplifier 134 and the target gain 195. Using the gain parameters 163, the centralized platform can attenuate the audio signal 160 such that the attenuation of the audio signal 160 compensates for the difference between the gain 182 of the power amplifier 134 and the target gain 195.

Figure 2:
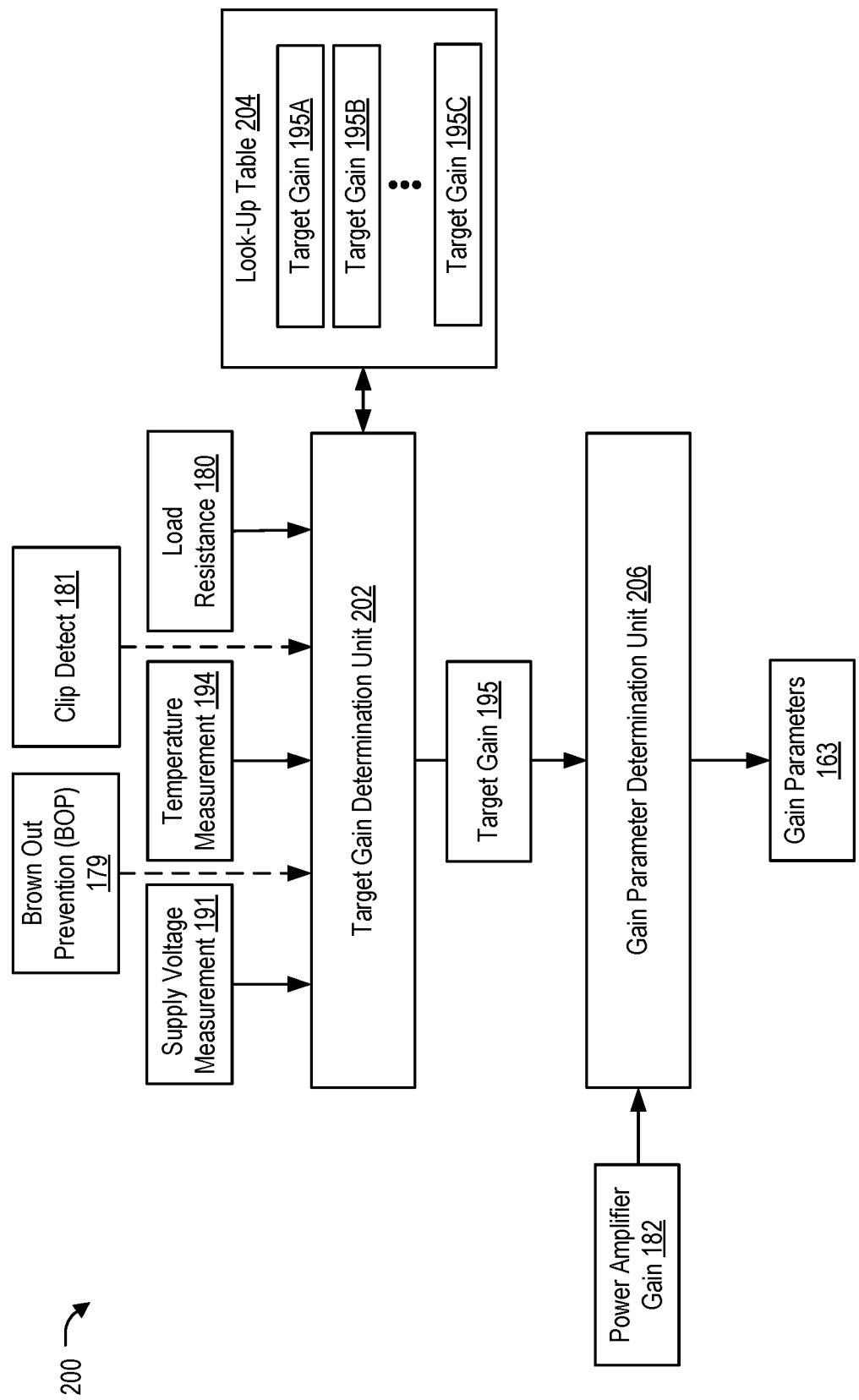
FIG. 2 is a block diagram of a particular illustrative aspect of a system configured to determine gain parameters for an amplitude limiting signal based on feedback from a peripheral device, in accordance with some examples of the present disclosure.

Referring to FIG. 2, a particular illustrative aspect of a system configured to determine gain parameters for an amplitude limiting signal based on feedback from a peripheral device is disclosed and generally designated 200. According to one implementation, the system 200 can be integrated into the peripheral device management unit 112 of FIG. 1B.

The system 200 includes a target gain determination unit 202, a look-up table 204, and a gain parameter determination unit 206. According to one implementation, the target gain determination unit 202, the gain parameter determination unit 206, or both, can be implemented using dedicated circuitry. As non-limiting examples, the target gain determination unit 202, the gain parameter determination unit 206, or both, can be implemented using an FPGA, an ASIC, etc. According to another implementation, the target gain determination unit 202, the gain parameter determination unit 206, or both, can be implemented by executing instructions 104 stored in the memory 102.

The supply voltage measurement 191, the temperature measurement 194, and the load resistance 180 are provided to the target gain determination unit 202. Optionally, the BOP data 179 and the clip detection data 181 are provided to the target gain determination unit 202. The target gain determination unit 202 can be configured to perform a table look-up operation based on at least one of the supply voltage measurement 191, the temperature measurement 194, or the load resistance 180 to determine the target gain 195.

To illustrate, the target gain determination unit 202 can access the look-up table 204. The look-up table 204 includes a plurality of target gains 195A-195C for different operating conditions. As a non-limiting example, the look-up table 204 includes a first target gain 195A for the power amplifier 134 at a first operating condition, a second target gain 195B for the power amplifier 134 at a second operating condition, a third target gain 195C for the power amplifier 134 at a third operating condition, etc. As described herein, an "operating condition" corresponds to a unique combination of the supply voltage measurement 191, the temperature measurement 194, and the load resistance 180. Although three target gains 195A-195C for three corresponding operating conditions are illustrated, in other implementations, the look-up table 204 can include additional target gains for additional operating conditions. As a non-limiting example, the look-up table 204 can include three-hundred target gains for three-hundred unique combinations of the supply voltage measurement 191, the temperature measurement 194, and the load resistance 180. The target gain determination unit 202 can insert the supply voltage measurement 191, the temperature measurement 194, and the load resistance 180 into the look-up table to identify the selected target gain 195. For example, the selected target gain 195 can correspond to any one of the target gains 195A-195C in the look-up table 204.

The gain parameter determination unit 206 can be configured to determine the difference between the gain 182 of the power amplifier 134 and the target gain 195. The gain parameter determination unit 206 can further be configured to generate the gain parameters 163 based on the difference. For example, the gain parameters 163 can indicate the amount of attenuation to be applied to the audio signal 160 to offset the difference between the gain 182 and the target gain 195.

The system 200 of FIG. 2 enables the determination of gain parameters 163 used to attenuate audio signals provided to the peripheral device 120 to ensure that the peripheral device 120 produces high-fidelity output audio. For example, based on feedback (e.g., the load resistance 180, the supply voltage measurement 191, and the temperature measurement 194), the system 200 can determine the target gain 195 for the power amplifier 134 that would likely result in high-fidelity output audio. The gain parameters 163, based on the difference between the gain 182 of the power amplifier 134 and the target gain 195, can be used to attenuate the audio signal 160 and compensate for the difference between the gain 182 of the power amplifier 134 and the target gain 195.

Figure 3:
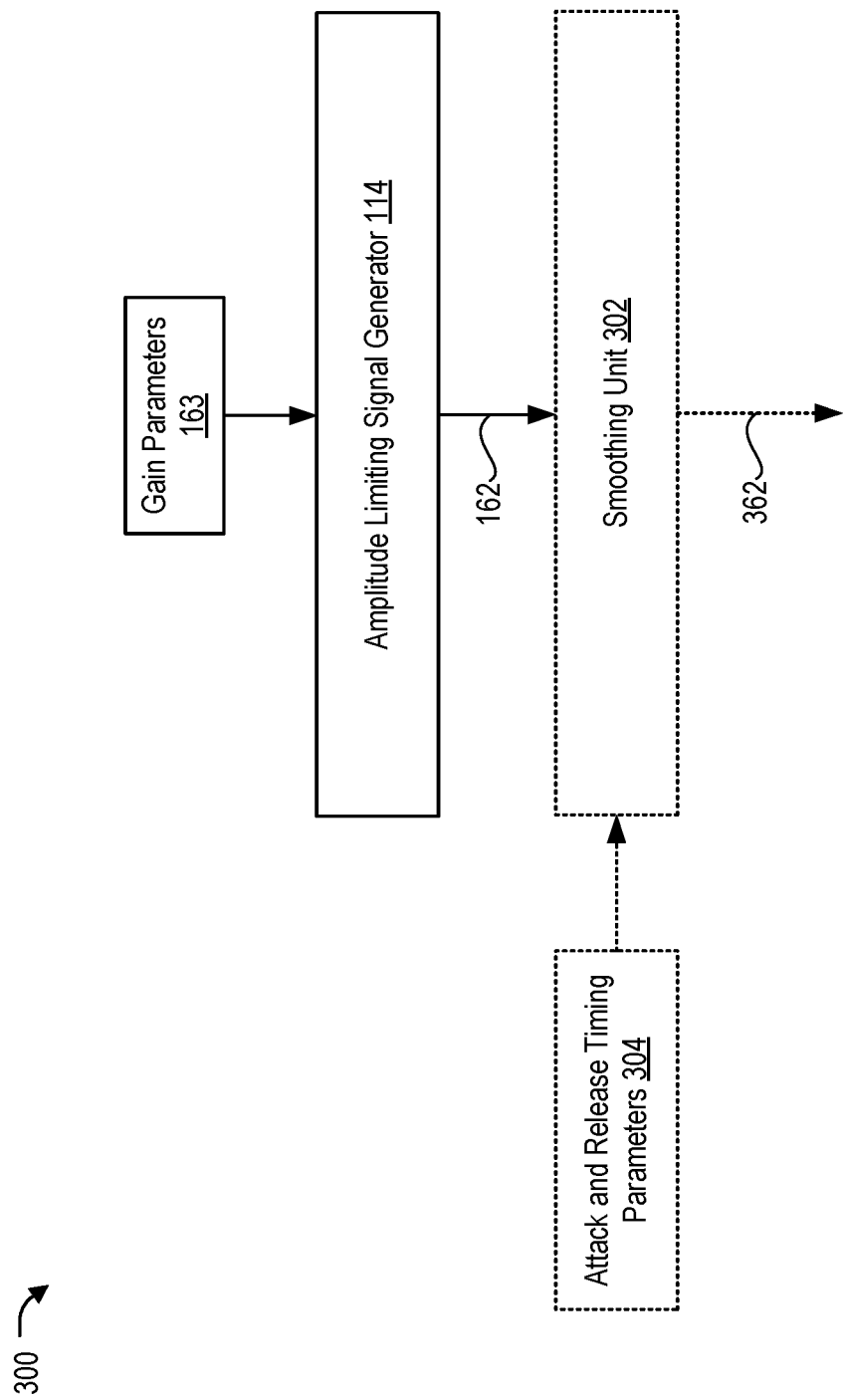
FIG. 3 is a block diagram of a particular illustrative aspect of a system configured to generate an attenuation signal based on gain parameters, in accordance with some examples of the present disclosure.

Referring to FIG. 3, a particular illustrative aspect of a system configured to generate an attenuation signal based on gain parameters is disclosed and generally designated 300. According to one implementation, the system 300 can be integrated into the processor 110 of FIG. 1B.

The system 300 includes the amplitude limiting signal generator 114 and a smoothing unit 302. According to one implementation, the amplitude limiting signal generator 114, the smoothing unit 302, or both, can be implemented using dedicated circuitry. As non-limiting examples, the amplitude limiting signal generator 114, the smoothing unit 302, or both, can be implemented using an FPGA, an ASIC, etc. According to another implementation, the amplitude limiting signal generator 114, the smoothing unit 302, or both, can be implemented by executing instructions 104 stored in the memory 102.

The amplitude limiting signal generator 114 can be configured to receive the gain parameters 163 and generate the amplitude limiting signal 162 based on the gain parameters 163. For example, the amplitude limiting signal 162 can include the gain parameters 163 such that, when combined with the audio signal 160, the amplitude limiting signal 162 modifies the audio signal 160 to generate the gain-adjusted audio signal 164.

According to one implementation, the amplitude limiting signal 162 is provided to a smoothing unit 302. The smoothing unit 302 can be configured to perform a smoothing operation on the gain parameters of the amplitude limiting signal 162 to generate a smoothed amplitude limiting signal 362 having smoothed gain parameters. To illustrate, attack and release timing parameters 304 can be provided to the smoothing unit 302. The smoothing unit 302 can smooth the gain parameters 163 received between an attack time ($t_a$) and a release time ($t_r$) to reduce an impact of any peak (e.g., spike) in the difference between the target gain 195 and the gain 182 of the power amplifier 134. Thus, in this implementation, the smoothed amplitude limiting signal 362 can be provided to the combiner 115, as opposed to the amplitude limiting signal 162.

The techniques described with respect to FIG. 3 reduce the impact of detected operating conditions that are outliers. To illustrate, if the supply voltage measurement 191 significantly deviates from the supply voltage measurement 191 at other instances, the difference between the target gain 195 and the gain 182 of the power amplifier 134 at the particular instance will be an outlier from the differences at the other instances. As a result, the gain parameters 163 at the particular instance will be an outlier from the gain parameters at the other instances. To alleviate discrepancies based on the outlier, the smoothing unit 302 can smooth the gain parameters 163 to reduce the likelihood of over-modifying the gain, which may cause distortion at the audio output.

Figure 4:
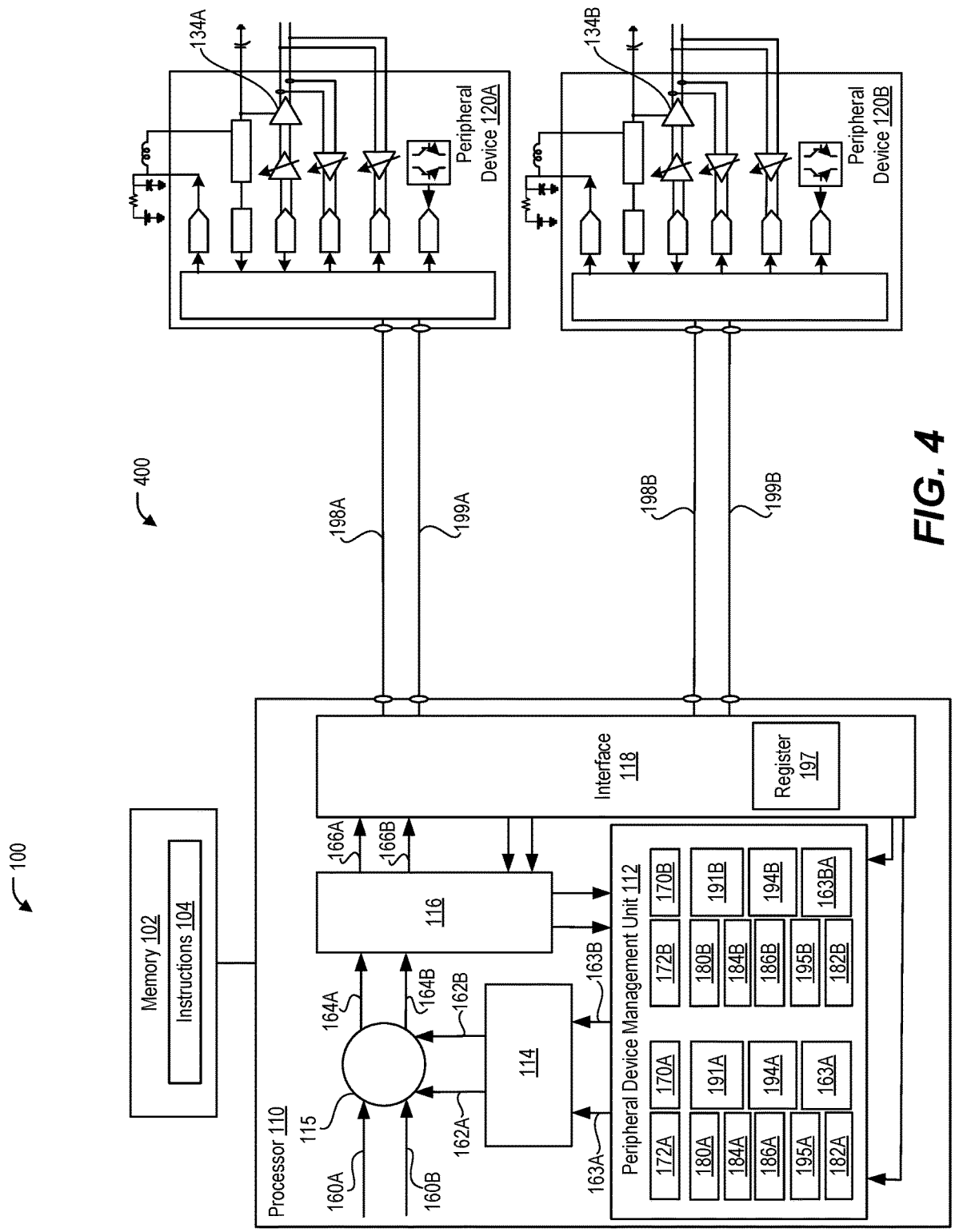
FIG. 4 is a block diagram of a particular illustrative aspect of another system configured to generate high-fidelity audio at different operating conditions using a centralized platform, in accordance with some examples of the present disclosure.

Referring to FIG. 4, a particular illustrative aspect of another system configured to generate high-fidelity audio at different operating conditions using a centralized platform is disclosed and generally designated 400. The system 400 includes the memory 102, the one or more processors 110, a peripheral device 120A, and a peripheral device 120B. The memory 102, the one or more processors 110, and the peripheral devices 120A, 120B can be integrated into a mobile device, such as a mobile phone.

The peripheral device 120A can include similar components to the peripheral device 120 of FIG. 1B and can operate in a substantially similar manner. For example, the processor 110 can send an output audio signal 166A to the peripheral device 120A via a data line 198A and a clock line 199A. A power amplifier 134A can be integrated into the peripheral device 120A to amplify an analog version of the output audio signal 166A from the processor 110. According to one implementation, the peripheral device 120A can include a speaker (not shown). Thus, the amplified signals from the power amplifier 134A can be provided to the speaker to produce an audio output.

Additionally, the peripheral device 120B can include similar components to the peripheral device 120 of FIG. 1B and can operate in a substantially similar manner. For example, the processor 110 can send an output audio signal 166B to the peripheral device 120A via a data line 198B and a clock line 199B. A power amplifier 134B can be integrated into the peripheral device 120B to amplify an analog version of an output audio signal 166B from the processor 110. According to one implementation, the peripheral device 120B can include a second speaker (not shown) or a haptic device. Thus, the amplified signals from the power amplifier 134B can be provided to the speaker to produce an audio output or can be provided to the haptic device to produce a haptic output.

Although two peripheral devices 120A, 120B are illustrated, in other implementations, the system 400 can include additional peripheral devices. As a non-limiting example, in one implementation, the system 400 can include five peripheral devices. As described below, the processor 110 uses feedback from the peripheral devices 120A, 120B to control a gain of the respective output audio signals 166A, 166B, and as a result, reduce an amount of distortion at the respective power amplifiers 134A, 134B.

For example, in a similar manner as described above with respect to FIG. 1, the peripheral device management unit 112 can determine the load resistance 180A associated with the power amplifier 134A based on audio clip data (e.g., a current measurement 184A and a voltage measurement 186A). Additionally, in a similar manner as described above, the peripheral device management unit 112 can also determine a supply voltage measurement 191A associated with the power amplifier 134A and a temperature measurement 194A associated with the power amplifier 134A. Based on the load resistance 180A, the supply voltage measurement 191A, and the temperature measurement 194A, the peripheral device management unit 112 can perform a table look-up operation to determine a target gain 195A for the power amplifier 134A. Based on a difference between the target gain 195A and a gain 182A (e.g., maximum gain) of the power amplifier 134A, the peripheral device management unit 112 can determine gain parameters 163A for an amplitude limiting signal 162A.

The gain parameters 163A based on the difference can indicate how to attenuate audio provided to peripheral device 120A. For example, the amplitude limiting signal generator 114 can be configured to generate the amplitude limiting signal 162A having the gain parameters 163A. An audio signal 160A and the amplitude limiting signal 162A are provided to the combiner 115. The combiner 115 can be configured to modify (e.g., attenuate) the audio signal 160A based at least in part on the amplitude limiting signal 162A to generate a gain-adjusted audio signal 164A. The gain-adjusted audio signal 164A can be provided to the CODEC 116, and the CODEC 116 can be configured to perform a digital-to-analog conversion operation on the gain-adjusted audio signal 164A to generate an updated version of the output audio signal 166A. As a result of modifying the gain in the audio signal 160A, audio output by the power amplifier 134A may experience a reduced amount of distortion.

As another example, in a similar manner as described above with respect to FIG. 1B, the peripheral device management unit 112 can determine the load resistance 180B associated with the power amplifier 134B based on audio clip data (e.g., a current measurement 184B and a voltage measurement 186B). Additionally, in a similar manner as described above, the peripheral device management unit 112 can also determine a supply voltage measurement 191B associated with the power amplifier 134B and a temperature measurement 194B associated with the power amplifier 134B. Based on the load resistance 180B, the supply voltage measurement 191B, and the temperature measurement 194B, the peripheral device management unit 112 can perform a table look-up operation to determine a target gain 195B for the power amplifier 134B. Based on a difference between the target gain 195B and a gain 182B (e.g., maximum gain) of the power amplifier 134B, the peripheral device management unit 112 can determine gain parameters 163B for an amplitude limiting signal 162B.

The gain parameters 163B based on the difference can indicate how to attenuate audio provided to peripheral device 120B. For example, the amplitude limiting signal generator 114 can be configured to generate the amplitude limiting signal 162B having the gain parameters 163B. An audio signal 160B and the amplitude limiting signal 162B are provided to the combiner 115. The combiner 115 can be configured to modify (e.g., attenuate) the audio signal 160B based at least in part on the amplitude limiting signal 162B to generate a gain-adjusted audio signal 164B. The gain-adjusted audio signal 164B can be provided to the CODEC 116, and the CODEC 116 can be configured to perform a digital-to-analog conversion operation on the gain-adjusted audio signal 164B to generate an updated version of the output audio signal 166B. As a result of modifying the gain in the audio signal 160B, audio output by the power amplifier 134B may experience a reduced amount of distortion.

Thus, because operation of the peripheral devices 120A, 120B are centrally managed at the processor 110 (as opposed to managed at the individual peripheral devices 120A, 120B), the processor 110 can identify system power consumption targets and adjust operations to ensure that the system power consumption targets are achieved.

Figure 5:
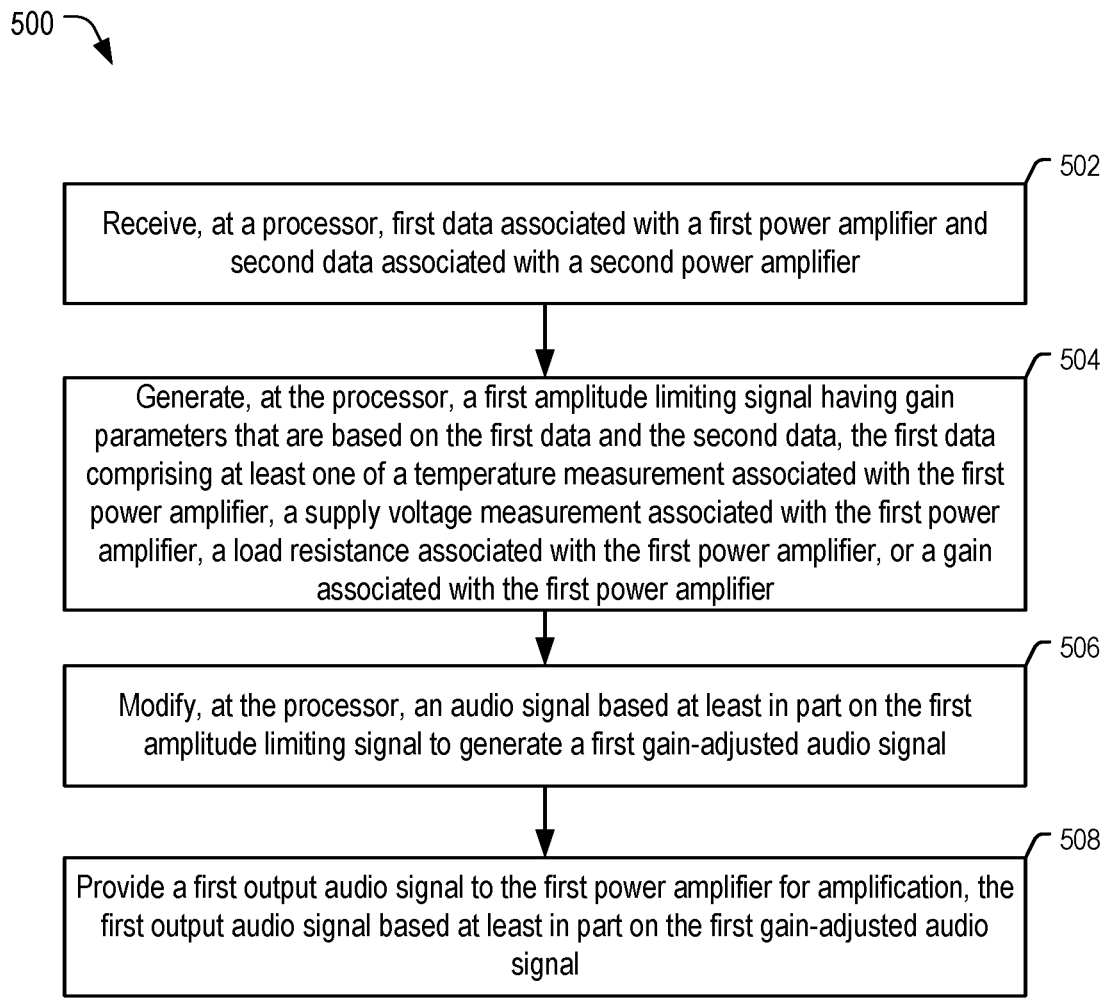
FIG. 5 is a diagram of a particular implementation of a method of managing a power amplifier, in accordance with some examples of the present disclosure.

Referring to FIG. 5 a particular implementation of a method 500 of managing a power amplifier is shown. In a particular aspect, one or more operations of the method 500 are performed by the system 100B of FIG. 1B, the system 200 of FIG. 2, the system 300 of FIG. 3, the system 400 of FIG. 4, or a combination thereof.

The method 500 includes receiving, at a processor, first data associated with a first power amplifier and second data associated with a second power amplifier, at block 502. For example, referring to FIG. 1A, the processor 110 receives the first data 150A associated with the power amplifier 134A and the second data 150B associated with the power amplifier 134B.

The method 500 also includes generating, at the processor, a first amplitude limiting signal having gain parameters that are based on the first data and the second data, at block 504. The first data includes at least one of a temperature measurement associated with the first power amplifier, a supply voltage measurement associated with the first power amplifier, an output load resistance associated with the first power amplifier, or a gain associated with the first power amplifier. For example, referring to FIG. 1A, the one or more processors 110 generate the first amplitude limiting signal 162A having gain parameters 163 based on the first data 150A and the second data 150B.

According to one implementation, the method 500 includes performing a table look-up operation based on at least one of the temperature measurement, the supply voltage, or the load resistance to determine a target gain. For example, referring to FIG. 2, the target gain determination unit 202 performs the table look-up operation based on the supply voltage measurement 191, the temperature measurement 194, and the load resistance 180 to determine the target gain 195. The method 500 can also include determining a difference between the gain associated with the power amplifier and the target gain. For example, referring to FIG.

2, the gain parameter determination unit 206 determines the difference between the target gain 195 and the gain 182 associated with the power amplifier 134. The gain parameters 163 of the amplitude limiting signal 162 are based on the difference.

The method 500 also includes modifying, at the processor, the audio signal based at least in part on the first amplitude limiting signal to generate a first gain-adjusted audio signal, at block 506. For example, referring to FIG. 1B, the combiner 115 modifies the audio signal 160 based on the amplitude limiting signal 162 to generate the gain-adjusted audio signal 164. According to one implementation, the method 500 includes performing a smoothing operation on the gain parameters of the amplitude limiting signal to generate a smoothed amplitude limiting signal having smoothed gain parameters. For example, referring to FIG. 3, the smoothing unit 302 performs the smoothing operation on the gain parameters 163 of the amplitude limiting signal 162 to generate the smoothed amplitude limiting signal 362 having smoothed gain parameters. In this implementation, the audio signal 160 is modified by applying the smoothed amplitude limiting signal 362 to the audio signal 160 (via the combiner 115) to generate the gain-adjusted audio signal 164.

The method 500 also includes providing a first output audio signal to the first power amplifier for amplification, at block 508. The first output audio signal is based at least in part on the first gain-adjusted audio signal. For example, referring to FIG. 1B, the CODEC 116 generates the output audio signal 166 at least in part by performing an analog-to-digital conversion operation on the gain-adjusted audio signal 164. The output audio signal 166 is provided to the peripheral device 120, and an analog version of the output audio signal 166 (e.g., the analog signal 168) is amplified by the power amplifier 134.

According to one implementation, the method 500 can include generating a second amplitude limiting signal having second gain parameters that are based on at least one of a second temperature measurement associated with a second power amplifier, a second supply voltage measurement associated with the second power amplifier, a second load resistance associated with the second power amplifier, or a second gain associated with the second power amplifier. The method 500 can also include modifying the audio signal (or another audio signal) based at least in part on the second amplitude limiting signal to generate a second gain-adjusted audio signal. The method 500 can also include providing a second output audio signal to the second power amplifier for amplification, the second output audio signal based at least in part on the second gain-adjusted audio signal.

The method 500 of FIG. 5 enables a centralized platform, such as the processor 110, to attenuate audio signals provided to the peripheral device 120 (based on operating conditions of the peripheral device 120) to ensure that the peripheral device 120 produces high-fidelity output audio. For example, based on feedback (e.g., the load resistance 180, the supply voltage measurement 191, and the temperature measurement 194), the centralized platform can determine the target gain 195 for the power amplifier 134 that would likely result in a high-fidelity output audio. The centralized platform can generate gain parameters 163 based on the difference between the gain 182 of the power amplifier 134 and the target gain 195. Using the gain parameters 163, the centralized platform can attenuate the audio signal 160 such that the attenuation of the audio signal 160 compensates for the difference between the gain 182 of the power amplifier 134 and the target gain 195.

The method 500 may be implemented by a FPGA device, an ASIC, a processing unit such as a central processing unit (CPU), a digital signal processing unit (DSP), a controller, another hardware device, firmware device, or any combination thereof. As an example, the method 500 may be performed by a processor that executes instructions, such as described with reference to FIG. 14.

Figure 6:
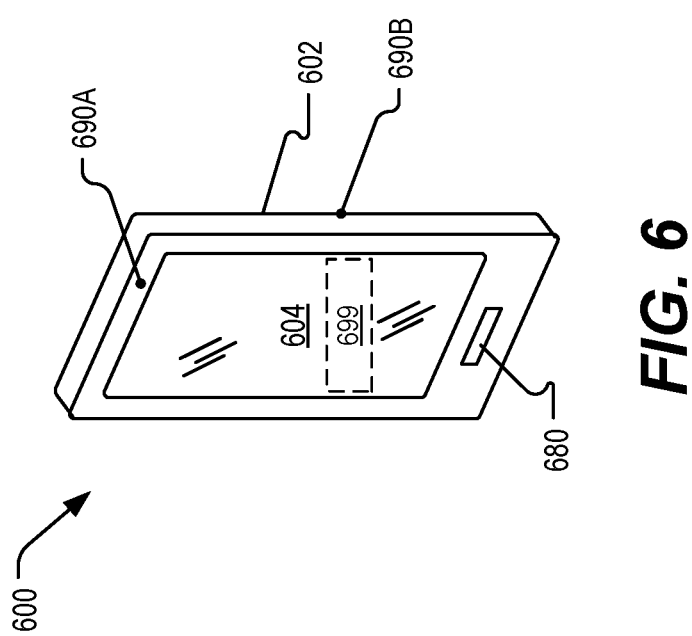
FIG. 6 is a diagram of a mobile device that includes a system configured to manage multiple power amplifiers using a centralized platform, in accordance with some examples of the present disclosure.

FIG. 6 depicts an implementation 600 in which a system 699 is integrated into a mobile device 602, such as a phone or tablet, as illustrative, non-limiting examples. The system 699 can correspond to the system 100A of FIG. 1A, the system 100B of FIG. 1i, the system 200 of FIG. 2, the system 300 of FIG. 3, the system 400 of FIG. 4, or a combination thereof. The mobile device 602 includes a display screen 604, a microphone 680, a first speaker 690A, and a second speaker 690B. According to one implementation, the first speaker 690A can be coupled to the peripheral device 120A of the system 100A, and the second speaker 690B can be coupled to the peripheral device 120B of the system 100A. For example, the first speaker 690A can receive the output (e.g., the amplified audio) from the power amplifier 134A, and the second speaker 690B can receive the output from the power amplifier 134B.

Figure 7:
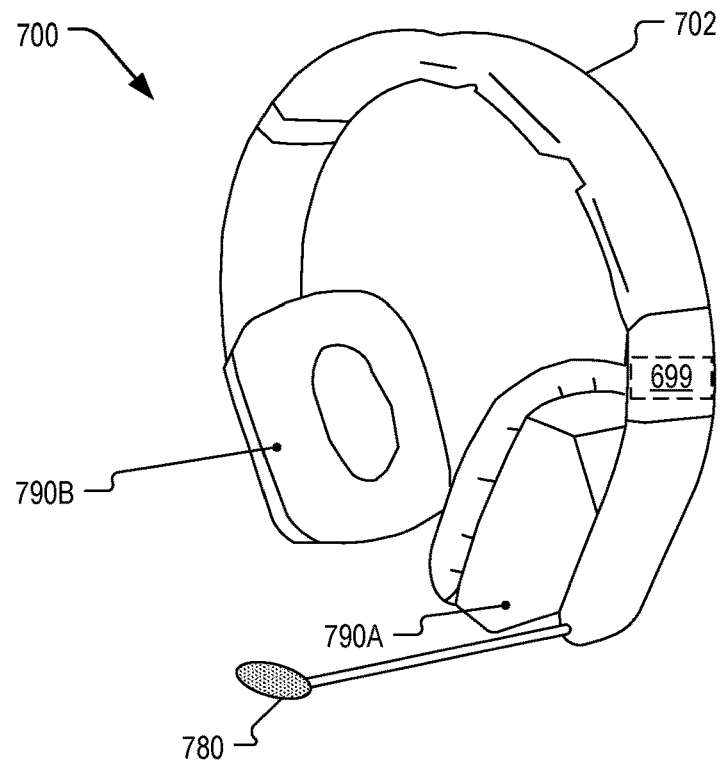
FIG. 7 is a diagram of a headset that includes a system configured to manage multiple power amplifiers using a centralized platform, in accordance with some examples of the present disclosure.

FIG. 7 depicts an implementation 700 in which the system 699 is integrated into a headset device 702. The headset device 702 includes a microphone 780, a first earphone 790A, and a second earphone 790B. The first earphone 790A can be coupled to the peripheral device 120A of the system 100A, and the second earphone 790B can be coupled to the peripheral device 120B of the system 100A. For example, the first earphone 790A can receive the output (e.g., the amplified audio) from the power amplifier 134A, and the second earphone 790B can receive the output from the power amplifier 134B.

Figure 8:
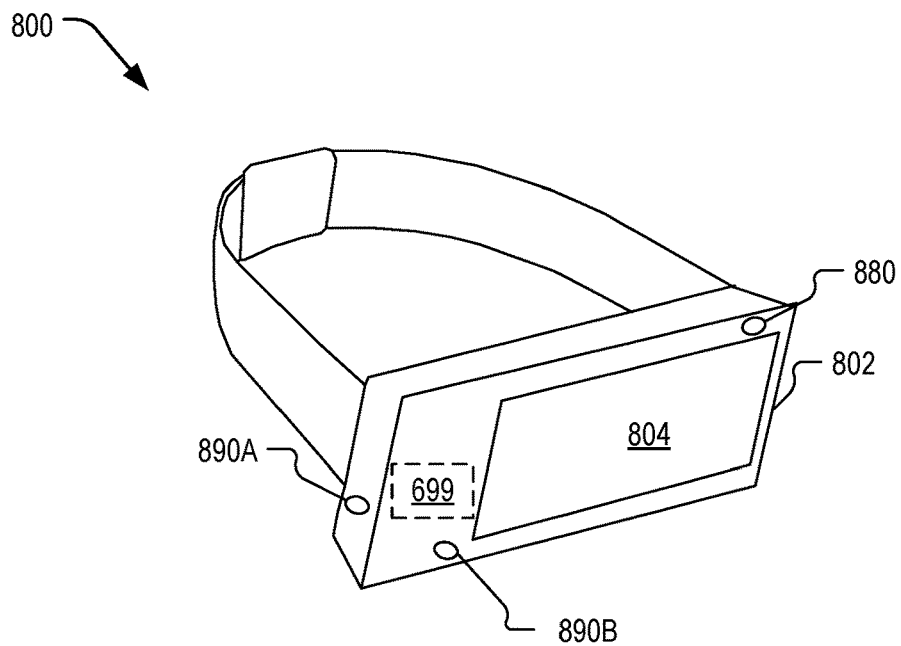
FIG. 8 is a diagram of a wearable electronic device that includes a system configured to manage multiple power amplifiers using a centralized platform, in accordance with some examples of the present disclosure.

FIG. 8 depicts an implementation 800 in which the system 699 is integrated into a wearable electronic device 802, illustrated as a "smart watch." The wearable electronic device 802 includes a display screen 804, a microphone 880, a first speaker 890A, and a second speaker 890B. The first speaker 890A can be coupled to the peripheral device 120A of the system 100A, and the second speaker 890B can be coupled to the peripheral device 120B of the system 100A. For example, the first speaker 890A can receive the output (e.g., the amplified audio) from the power amplifier 134A, and the second speaker 890B can receive the output from the power amplifier 134B.

Figure 9:
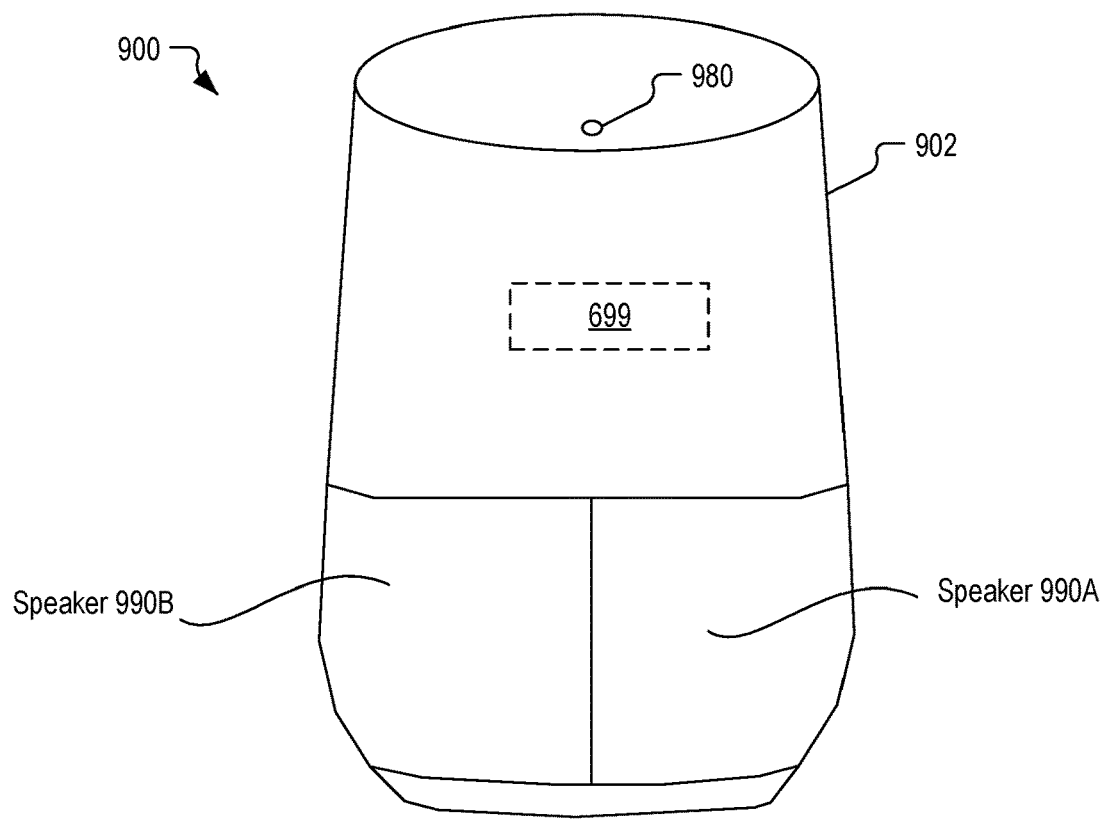
FIG. 9 is a diagram of a voice-controlled speaker system that includes a system configured to manage multiple power amplifiers using a centralized platform, in accordance with some examples of the present disclosure.

FIG. 9 is an implementation 900 in which the system 699 is integrated into a wireless speaker and voice activated device 902. The wireless speaker and voice activated device 902 can have wireless network connectivity and is configured to execute an assistant operation. The wireless speaker and voice activated device 902 includes a microphone 980, a first speaker 990A, and a second speaker 990B. The first speaker 990A can be coupled to the peripheral device 120A of the system 100A, and the second speaker 990B can be coupled to the peripheral device 120B of the system 100A. For example, the first speaker 990A can receive the output (e.g., the amplified audio) from the power amplifier 134A, and the second speaker 990B can receive the output from the power amplifier 134B.

Figure 10:
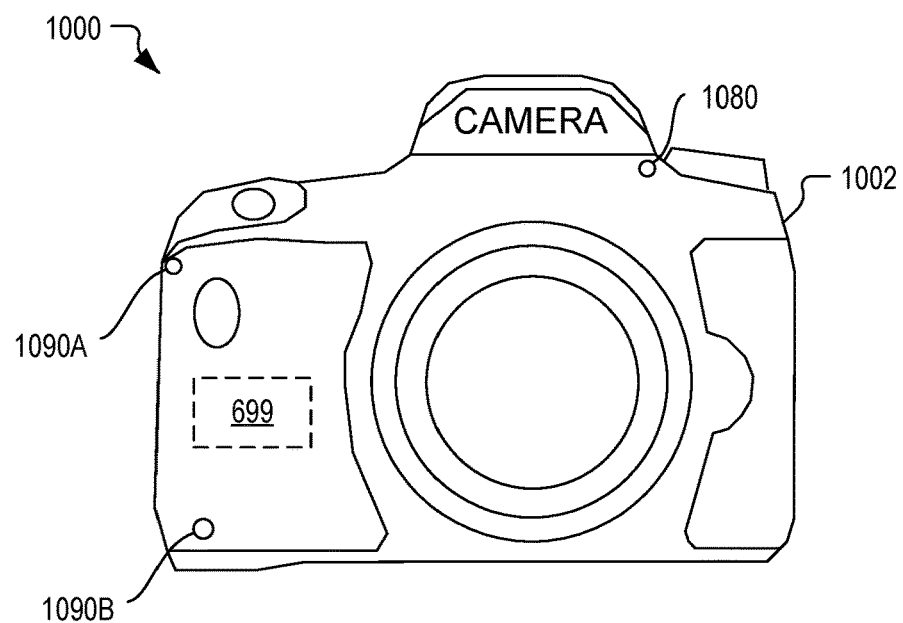
FIG. 10 is a diagram of a camera that includes a system configured to manage multiple power amplifiers using a centralized platform, in accordance with some examples of the present disclosure.

FIG. 10 depicts an implementation 1000 in which the system 699 is integrated into a portable electronic device that corresponds to a camera device 1002. The camera device 1002 includes a microphone 1080, a first speaker 1090A, and a second speaker 1090B. The first speaker 1090A can be coupled to the peripheral device 120A of the system 100A, and the second speaker 1090B can be coupled to the peripheral device 120B of the system 100A. For example, the first speaker 1090A can receive the output (e.g., the amplified audio) from the power amplifier 134A, and the second speaker 1090B can receive the output from the power amplifier 134B.

Figure 11:
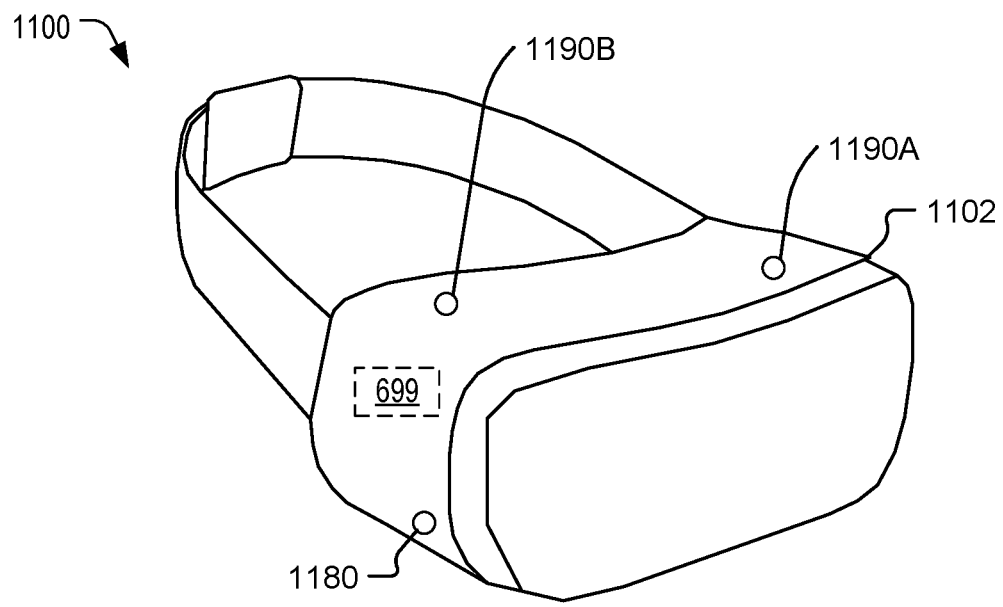
FIG. 11 is a diagram of a headset, such as a virtual reality, mixed reality, or augmented reality headset, that includes a system configured to manage multiple power amplifiers using a centralized platform, in accordance with some examples of the present disclosure.

FIG. 11 depicts an implementation 1100 in which the system 699 is integrated into a portable electronic device that corresponds to an extended reality ("XR") headset 1102, such as a virtual reality ("VR"), augmented reality ("AR"), or mixed reality ("MR") headset device. The extended reality headset 1102 includes a microphone 1180, a first speaker 1190A, and a second speaker 1190B. The first speaker 1190A can be coupled to the peripheral device 120A of the system 100A, and the second speaker 1190B can be coupled to the peripheral device 120B of the system 100A. For example, the first speaker 1190A can receive the output (e.g., the amplified audio) from the power amplifier 134A, and the second speaker 1190B can receive the output from the power amplifier 134B.

Figure 12:
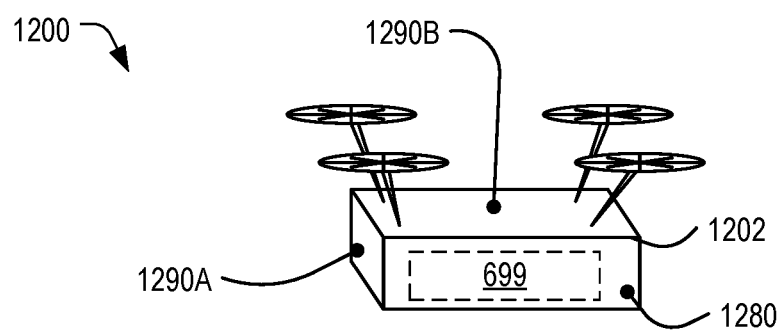
FIG. 12 is a diagram of a first example of a vehicle that includes a system configured to manage multiple power amplifiers using a centralized platform, in accordance with some examples of the present disclosure.

FIG. 12 depicts an implementation 1200 in which the system 699 corresponds to or is integrated within a vehicle 1202, illustrated as a manned or unmanned aerial device (e.g., a package delivery drone). The vehicle 1202 includes a microphone 1280, a first speaker 1290A, and a second speaker 1290B. The first speaker 1290A can be coupled to the peripheral device 120A of the system 100A, and the second speaker 1290B can be coupled to the peripheral device 120B of the system 100A. For example, the first speaker 1290A can receive the output (e.g., the amplified audio) from the power amplifier 134A, and the second speaker 1290B can receive the output from the power amplifier 134B.

Figure 13:
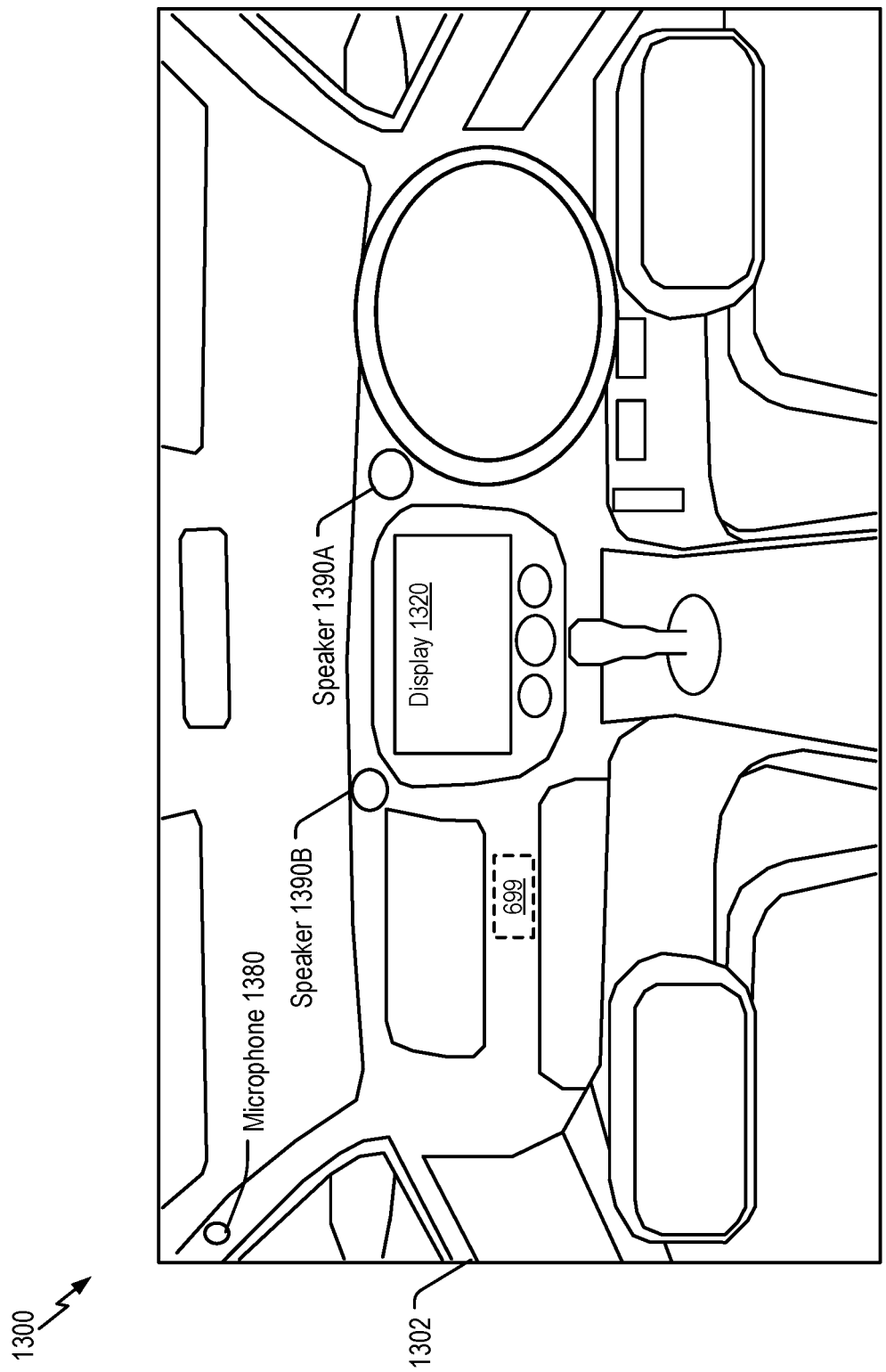
FIG. 13 is a diagram of a second example of a vehicle that includes a system configured to manage multiple power amplifiers using a centralized platform, in accordance with some examples of the present disclosure.

FIG. 13 depicts another implementation 1300 in which the system 699 corresponds to, or is integrated within, a vehicle 1302, illustrated as a car. The vehicle 1302 includes a display screen 1320, a microphone 1380, a first speaker 1390A, and a second speaker 1390B. The first speaker 1390A can be coupled to the peripheral device 120A of the system 100A, and the second speaker 1390B can be coupled to the peripheral device 120B of the system 100A. For example, the first speaker 1390A can receive the output (e.g., the amplified audio) from the power amplifier 134A, and the second speaker 1390B can receive the output from the power amplifier 134B.

Figure 14:
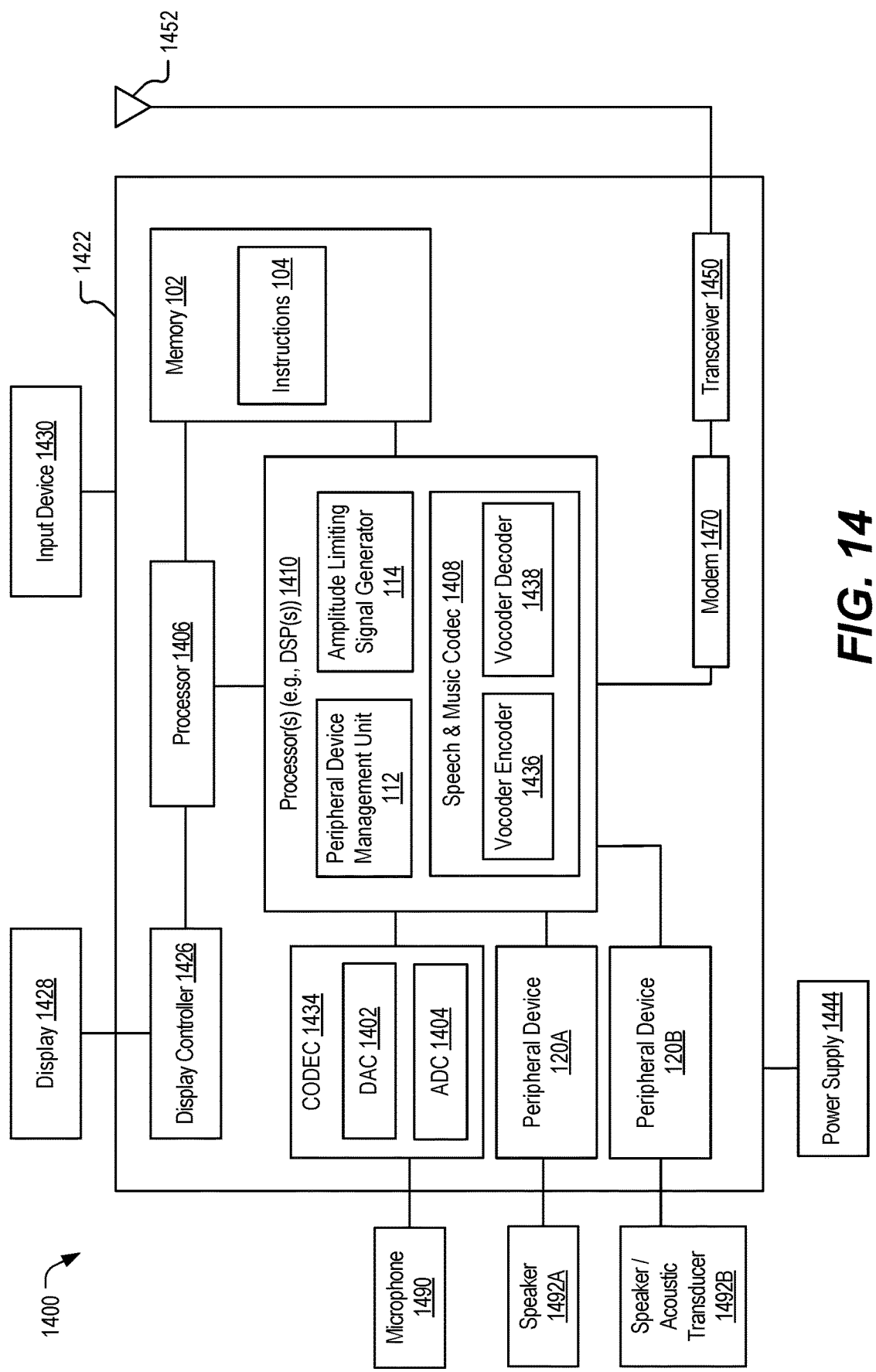
FIG. 14 is a block diagram of a particular illustrative example of a device that is operable to generate high-fidelity audio at different operating conditions using a centralized platform, in accordance with some examples of the present disclosure.

Referring to FIG. 14, a block diagram of a particular illustrative implementation of a device is depicted and generally designated 1400. In various implementations, the device 1400 may have more or fewer components than illustrated in FIG. 14. In an illustrative implementation, the device 1400 may include components of the system 100A of FIG. 1A, components of the system 100B of FIG. 1B, components of the system 200 of FIG. 2, components of the system 300 of FIG. 3, or components of the system 400 of FIG. 4. In an illustrative implementation, the device 1400 may perform one or more operations described with reference to FIGS. 1A-13.

In a particular implementation, the device 1400 includes a processor 1406 (e.g., a CPU). The device 1400 may include one or more additional processors 1410 (e.g., one or more DSPs). In a particular aspect, the processor(s) 110 corresponds to the processor 1406, the processors 1410, or a combination thereof. The processors 1410 may include a speech and music coder-decoder (CODEC) 1408 that includes a voice coder ("vocoder") encoder 1436, a vocoder decoder 1438. According to one implementation, the speech and music CODEC 1408 corresponds to the CODEC 116 of FIG. 1B. The processors 1410 may also include the peripheral device management unit 112 and the amplitude limiting signal generator 114.

The device 1400 may include the memory 102 and a CODEC 1434. According to one implementation, the CODEC 1434 corresponds to the CODEC 116 of FIG. 1B. The memory 102 may include the instructions 104, that are executable by the one or more additional processors 1410 (or the processor 1406) to implement the functionality described with reference to the peripheral device management unit 112 and the amplitude limiting signal generator 114. The device 1400 may include a modem 1470 coupled, via a transceiver 1450, to an antenna 1452. The modem 1470 may be configured to transmit a signal to a second device (not shown).

The device 1400 may include a display 1428 coupled to a display controller 1426. The peripheral device 120A and the peripheral device 120B may be coupled to the processor 1410. A speaker 1492A may be coupled to the peripheral device 120A, and a speaker 1492B may be coupled to the peripheral device 120B. An amplified output signal from the peripheral device 120A can be provided to the speaker 1492A to produce a high-fidelity output, and an amplified output signal from the peripheral device 120B can be provided to the speaker 1492B to produce a high-fidelity output. A microphone 1490 may be coupled to the CODEC 1434. The CODEC 1434 may include a digital-to-analog converter (DAC) 1402, an analog-to-digital converter (ADC) 1404, or both. In a particular implementation, the CODEC 1434 may receive analog signals from the microphone 1490, convert the analog signals to digital signals using the analog-to-digital converter 1404, and provide the digital signals to the speech and music codec 1408. The speech and music codec 1408 may process the digital signals.

In a particular implementation, the device 1400 may be included in a system-in-package or system-on-chip device 1422. In a particular implementation, the memory 102, the processor 1406, the processors 1410, the display controller 1426, the CODEC 1434, the peripheral device 120A, the peripheral device 120B, the transceiver 1450, and the modem 1470 are included in a system-in-package or system-on-chip device 1422. In a particular implementation, an input device 1430 and a power supply 1444 are coupled to the system-in-package or system-on-chip device 1422. Moreover, in a particular implementation, as illustrated in FIG. 14, the display 1428, the input device 1430, the speaker 1492A, the speaker 1492B, the microphone 1490, the antenna 1452, and the power supply 1444 are external to the system-in-package or system-on-chip device 1422. In a particular implementation, each of the display 1428, the input device 1430, the speaker 1492A, the speaker 1492B, the microphone 1490, the antenna 1452, and the power supply 1444 may be coupled to a component of the system-in-package or system-on-chip device 1422, such as an interface or a controller.

The device 1400 may include a smart speaker, a speaker bar, a mobile communication device, a smart phone, a cellular phone, a laptop computer, a computer, a tablet, a personal digital assistant, a display device, a television, a gaming console, a music player, a radio, a digital video player, a digital video disc (DVD) player, a tuner, a camera, a navigation device, a vehicle, a headset, an augmented reality headset, a mixed reality headset, a virtual reality headset, an aerial vehicle, a home automation system, a voice-activated device, a wireless speaker and voice activated device, a portable electronic device, a car, a vehicle, a computing device, a communication device, an internet-of-things (IoT) device, a virtual reality (VR) device, a base station, a mobile device, or any combination thereof.

In conjunction with the described implementations, an apparatus includes means for receiving first data associated with a first power amplifier and second data associated with a second power amplifier. For example, the means for receiving the first data and the second data include the one or more processors 110, the processor 1406, the one or more processors 1410, one or more other circuits or components configured to receive the first data and the second data, or any combination thereof.

The apparatus also includes means for generating a first amplitude limiting signal having gain parameters that are based on the first data and the second data. The first data includes at least one of a temperature measurement associated with a first power amplifier, a supply voltage measurement, a load resistance associated with the first power amplifier, or a gain associated with the first power amplifier. The means for generating the amplitude limiting signal include the amplitude limiting signal generator 114, the peripheral device management unit 112, the target gain determination unit 202, the gain parameter determination unit 206, the smoothing unit 302, the one or more processors 110, the processor 1406, the one or more processors 1410, one or more other circuits or components configured to generate an amplitude limiting signal, or any combination thereof.

The apparatus also includes means for modifying an audio signal based at least in part on the first amplitude limiting signal to generate a first gain-adjusted audio signal. For example, the means for modifying the audio signal include the combiner 115, the one or more processors 110, the processor 1406, the one or more processors 1410, one or more other circuits or components configured to modify an audio signal, or any combination thereof.

The apparatus also includes means for providing a first output audio signal to the first power amplifier for amplification. The first output audio signal is based at least in part on the first gain-adjusted audio signal. The means for providing the first output audio signal include the CODEC 116, the one or more processors 110, the processor 1406, the one or more processors 1410, the interface 118, the speech and music CODEC 1408, the CODEC 1434, one or more other circuits or components configured to provide an output audio signal, or any combination thereof.

The apparatus may also include means for performing a table look-up operation based on at least one of the temperature measurement, the supply voltage measurement, or the load resistance to determine a target gain. For example, the means for performing the table look-up operation include the one or more processors 110, the processor 1406, the one or more processors 1410, the peripheral device management unit 112, the target gain determination unit 202, the look-up table 204, one or more other circuits or components configured to perform a table look-up operation, or any combination thereof.

The apparatus may also include means for determining a difference between the gain associated with the power amplifier and the target gain. For example, the means for determining the difference include the one or more processors 110, the processor 1406, the one or more processors 1410, the peripheral device management unit 112, the gain parameter determination unit 206, one or more other circuits or components configured to determine a difference between a gain and a target gain, or any combination thereof.

The apparatus may also include means for performing a smoothing operation on the gain parameters of the first amplitude limiting signal to generate a smoothed amplitude limiting signal having smoothed gain parameters. For example, the means for performing the smoothing operation include the one or more processors 110, the processor 1406, the one or more processors 1410, the peripheral device management unit 112, the smoothing unit 302, one or more other circuits or components configured to perform a smoothing operation, or any combination thereof.

The apparatus may also include means for applying the smoothed amplitude limiting signal to the audio signal to generate the first gain-adjusted audio signal. For example, the means for applying the smoothed amplitude limiting signal include the one or more processors 110, the processor 1406, the one or more processors 1410, the peripheral device management unit 112, the combiner 115, one or more other circuits or components configured to apply a smoothed amplitude limiting signal to an audio signal, or any combination thereof.

In some implementations, a non-transitory computer-readable medium (e.g., a computer-readable storage device, such as the memory 102) includes instructions (e.g., the instructions 104) that, when executed by one or more processors (e.g., the one or more processors 1410 or the processor 1406), cause the one or more processors to receive an audio signal (e.g., the audio signal 160). The instructions, when executed by the one or more processors, also cause the one or more processors to generate an amplitude limiting signal (e.g., the amplitude limiting signal 162) having gain parameters (e.g., the gain parameters 163) that are based on at least one of a temperature measurement (e.g., the temperature measurement 194) associated with a power amplifier (e.g., the power amplifier 134), a supply voltage measurement (e.g., the supply voltage measurement 191), a load resistance (e.g., the load resistance 180) associated with the power amplifier, or a gain (e.g., the gain 182) associated with the power amplifier. The instructions, when executed by the one or more processors, also cause the one or more processors to modify the audio signal based at least in part on the amplitude limiting signal to generate a gain-adjusted audio signal (e.g., the gain-adjusted audio signal 164). The instructions, when executed by the one or more processors, also cause the one or more processors to provide an output audio signal (e.g., the output audio signal 166) to the power amplifier for amplification. The output audio signal is based at least in part on the gain-adjusted audio signal.

This disclosure includes the following examples.

Example 1 includes a device comprising: a memory; and one or more processors coupled to the memory, the one or more processors configured to: receive first data associated with a first power amplifier and second data associated with a second power amplifier; generate a first amplitude limiting signal having gain parameters that are based on the first data and the second data, the first data comprising at least one of a temperature measurement associated with the first power amplifier, a supply voltage measurement associated with the first power amplifier, a load resistance associated with the first power amplifier, or a gain associated with the first power amplifier; modify an audio signal based at least in part on the first amplitude limiting signal to generate a first gain-adjusted audio signal; and provide a first output audio signal to the first power amplifier for amplification, the first output audio signal based at least in part on the first gain-adjusted audio signal.

Example 2 includes the device of example 1, wherein the one or more processors are further configured to: perform a table look-up operation based on at least one of the temperature measurement, the supply voltage measurement, or the load resistance to determine a target gain; and determine a difference between the gain associated with the first power amplifier and the target gain, wherein the gain parameters of the first amplitude limiting signal are based on the difference.

Example 3 includes the device of any of examples 1 to 2, wherein the one or more processors are further configured to: perform a smoothing operation on the gain parameters of the first amplitude limiting signal to generate a smoothed amplitude limiting signal having smoothed gain parameters; and apply the smoothed amplitude limiting signal to the audio signal to generate the first gain-adjusted audio signal.

Example 4 includes the device of any of examples 1 to 3, wherein the load resistance associated with the first power amplifier corresponds to a load resistance of a speaker coupled to an output of the first power amplifier.

Example 5 includes the device of any of examples 1 to 4, wherein the one or more processors are further configured to: generate a second amplitude limiting signal having second gain parameters that are based on the second data, the second data comprising at least one of a second temperature measurement associated with the second power amplifier, a second supply voltage measurement associated with the second power amplifier, a second load resistance associated with the second power amplifier, or a second gain associated with the second power amplifier; modify the audio signal based at least in part on the second amplitude limiting signal to generate a second gain-adjusted audio signal; and provide a second output audio signal to the second power amplifier for amplification, the second output audio signal based at least in part on the second gain-adjusted audio signal.

Example 6 includes the device of any of examples 1 to 5, wherein the one or more processors are integrated into a mobile device and further configured to: determine a battery level associated with the mobile device; and adjust at least one of the first amplitude limiting signal or the second amplitude limiting signal based on the battery level.

Example 7 includes the device of any of examples 1 to 6, further comprising: a first peripheral device, wherein the first power amplifier is integrated into the first peripheral device; and a second peripheral device, wherein the second power amplifier is integrated into the second peripheral device.

Example 8 includes the device of any of examples 1 to 7, wherein the first peripheral device comprises a speaker, and wherein the second peripheral device comprises a second speaker or a haptic device.

Example 9 includes the device of any of examples 1 to 8, wherein the one or more processors are further configured to perform an analog-to-digital conversion operation on the first gain-adjusted audio signal to generate the first output audio signal.

Example 10 includes the device of any of examples 1 to 9, wherein the one or more processors are further configured to: receive a voltage measurement associated with an amplified signal of the first power amplifier; receive a current measurement associated with the amplified signal of the first power amplifier; and determine the load resistance associated with the first power amplifier based on the voltage measurement and the current measurement.

Example 11 includes a method of managing power amplifiers, the method comprising: receiving, at a processor, first data associated with a first power amplifier and second data associated with a second power amplifier; generating, at the processor, a first amplitude limiting signal having gain parameters that are based on the first data and the second data, the first data comprising at least one of a temperature measurement associated with the first power amplifier, a supply voltage measurement associated with the first power amplifier, a load resistance associated with the first power amplifier, or a gain associated with the first power amplifier; modifying, at the processor, an audio signal based at least in part on the first amplitude limiting signal to generate a first gain-adjusted audio signal; and providing a first output audio signal to the first power amplifier for amplification, the first output audio signal based at least in part on the first gain-adjusted audio signal.

Example 12 includes the method of example 11, further comprising: performing a table look-up operation based on at least one of the temperature measurement, the supply voltage measurement, or the load resistance to determine a target gain; and determining a difference between the gain associated with the first power amplifier and the target gain, wherein the gain parameters of the first amplitude limiting signal are based on the difference.

Example 13 includes the method of any of examples 11 to 12, further comprising: performing a smoothing operation on the gain parameters of the first amplitude limiting signal to generate a smoothed amplitude limiting signal having smoothed gain parameters, wherein modifying the audio signal based at least in part on the first amplitude limiting signal comprises: applying the smoothed amplitude limiting signal to the audio signal to generate the first gain-adjusted audio signal.

Example 14 includes the method of any of examples 11 to 13, wherein the load resistance associated with the first power amplifier corresponds to a load resistance of a speaker coupled to an output of the first power amplifier, a load resistance of a haptic oscillator coupled to the output of the first power amplifier, or a load resistance of a peripheral acoustic device coupled to the output of the first power amplifier.

Example 15 includes the method of any of examples 11 to 14, further comprising: generating a second amplitude limiting signal having second gain parameters that are based on the second data, the second data comprising at least one of a second temperature measurement associated with a second power amplifier, a second supply voltage measurement associated with the second power amplifier, a second load resistance associated with the second power amplifier, or a second gain associated with the second power amplifier; modifying the audio signal based at least in part on the second amplitude limiting signal to generate a second gain-adjusted audio signal; and providing a second output audio signal to the second power amplifier for amplification, the second output audio signal based at least in part on the second gain-adjusted audio signal.

Example 16 includes the method of any of examples 11 to 15, further comprising: determining a battery level associated with the mobile device; and adjusting at least one of the first amplitude limiting signal or the second amplitude limiting signal based on the battery level.

Example 17 includes the method of any of examples 11 to 16, wherein the first power amplifier is integrated into a first peripheral device to the processor, and wherein the second power amplifier is integrated into a second peripheral device to the processor.

Example 18 includes the method of any of examples 11 to 17, wherein the first peripheral device comprises a speaker, and wherein the second peripheral device comprises a second speaker, a haptic device, or a peripheral acoustic device.

Example 19 includes the method of any of examples 11 to 18, further comprising performing an analog-to-digital conversion operation on the first gain-adjusted audio signal to generate the first output audio signal.

Example 20 includes the method of any of examples 11 to 19, further comprising: receiving a voltage measurement associated with an amplified signal of the first power amplifier; receiving a current measurement associated with the amplified signal of the first power amplifier; and determining the load resistance associated with the first power amplifier based on the voltage measurement and the current measurement.

Example 21 includes a non-transitory computer-readable medium including instructions that, when executed by one or more processors of a device, cause the one or more processors to: receive first data associated with a first power amplifier and second data associated with a second power amplifier; generate a first amplitude limiting signal having gain parameters that are based on the first data and the second data, the first data comprising at least one of a temperature measurement associated with a first power amplifier, a supply voltage measurement, a load resistance associated with the first power amplifier, or a gain associated with the first power amplifier; modify an audio signal based at least in part on the first amplitude limiting signal to generate a first gain-adjusted audio signal; and provide a first output audio signal to the first power amplifier for amplification, the first output audio signal based at least in part on the first gain-adjusted audio signal.

Example 22 includes the non-transitory computer-readable medium of example 21, wherein the instructions, when executed by the one or more processors, further cause the one or more processors to: perform a table look-up operation based on at least one of the temperature measurement, the supply voltage measurement, or the load resistance to determine a target gain; and determine a difference between the gain associated with the first power amplifier and the target gain, wherein the gain parameters of the first amplitude limiting signal are based on the difference.

Example 23 includes the non-transitory computer-readable medium of any of examples 21 to 22, wherein the instructions, when executed by the one or more processors, further cause the one or more processors to: perform a smoothing operation on the gain parameters of the first amplitude limiting signal to generate a smoothed amplitude limiting signal having smoothed gain parameters; and apply the smoothed amplitude limiting signal to the audio signal to generate the first gain-adjusted audio signal.

Example 24 includes the non-transitory computer-readable medium of any of examples 21 to 23, wherein the load resistance associated with the first power amplifier corresponds to a load resistance of a speaker coupled to an output of the first power amplifier.

Example 25 includes the non-transitory computer-readable medium of any of examples 21 to 24, wherein the instructions, when executed by the one or more processors, further cause the one or more processors to: generate a second amplitude limiting signal having second gain parameters that are based on the second data, the second data comprising at least one of a second temperature measurement associated with a second power amplifier, a second supply voltage measurement associated with the second power amplifier, a second load resistance associated with the second power amplifier, or a second gain associated with the second power amplifier; modify the audio signal based at least in part on the second amplitude limiting signal to generate a second gain-adjusted audio signal; and provide a second output audio signal to the second power amplifier for amplification, the second output audio signal based at least in part on the second gain-adjusted audio signal.

Example 26 includes the non-transitory computer-readable medium of any of examples 21 to 25, wherein the instructions, when executed by the one or more processors, further cause the one or more processors to: determine a battery level associated with the mobile device; and adjust at least one of the first amplitude limiting signal or the second amplitude limiting signal based on the battery level.

Example 27 includes the non-transitory computer-readable medium of any of examples 21 to 26, wherein the instructions, when executed by the one or more processors, further cause the one or more processors to perform an analog-to-digital conversion operation on the first gain-adjusted audio signal to generate the first output audio signal.

Example 28 includes the non-transitory computer-readable medium of any of examples 21 to 27, wherein the instructions, when executed by the one or more processors, further cause the one or more processors to: receive a voltage measurement associated with an amplified signal of the power amplifier; receive a current measurement associated with the amplified signal of the power amplifier; and determine the load resistance associated with the power amplifier based on the voltage measurement and the current measurement.

Example 29 includes the non-transitory computer-readable medium of any of examples 21 to 28, wherein the first power amplifier is integrated into a first peripheral device to the processor, and wherein the second power amplifier is integrated into a second peripheral device to the one or more processors.

Example 30 includes the non-transitory computer-readable medium of any of examples 21 to 29, wherein the first peripheral device comprises a speaker, and wherein the second peripheral device comprises a second speaker or a haptic device.

Example 31 includes an apparatus comprising: means for receiving first data associated with a first power amplifier and second data associated with a second power amplifier; means for generating a first amplitude limiting signal having gain parameters that are based on the first data and the second data, the first data comprising at least one of a temperature measurement associated with a first power amplifier, a supply voltage measurement, a load resistance associated with the first power amplifier, or a gain associated with the first power amplifier; means for modifying an audio signal based at least in part on the first amplitude limiting signal to generate a first gain-adjusted audio signal; and means for providing a first output audio signal to the first power amplifier for amplification, the first output audio signal based at least in part on the first gain-adjusted audio signal.

Example 32 includes the apparatus of example 31, further comprising: means for performing a table look-up operation based on at least one of the temperature measurement, the supply voltage measurement, or the load resistance to determine a target gain; and means for determining a difference between the gain associated with the first power amplifier and the target gain, wherein the gain parameters of the first amplitude limiting signal are based on the difference.

Example 33 includes the apparatus of any of examples 31 to 32, further comprising: means for performing a smoothing operation on the gain parameters of the first amplitude limiting signal to generate a smoothed amplitude limiting signal having smoothed gain parameters; and means for applying the smoothed amplitude limiting signal to the audio signal to generate the first gain-adjusted audio signal.

Example 34 includes the apparatus of any of examples 31 to 33, wherein the load resistance associated with the first power amplifier corresponds to a load resistance of a speaker coupled to an output of the first power amplifier.

Example 35 includes the apparatus of any of examples 31 to 34, further comprising: means for generating a second amplitude limiting signal having second gain parameters that are based on the second data, the second data comprising at least one of a second temperature measurement associated with a second power amplifier, a second supply voltage measurement associated with the second power amplifier, a second load resistance associated with the second power amplifier, or a second gain associated with the second power amplifier; means for modifying the audio signal based at least in part on the second amplitude limiting signal to generate a second gain-adjusted audio signal; and means for providing a second output audio signal to the second power amplifier for amplification, the second output audio signal based at least in part on the second gain-adjusted audio signal.

Example 36 includes the apparatus of any of examples 31 to 35, further comprising: means for determine a battery level associated with the mobile device; and adjusting at least one of the first amplitude limiting signal or the second amplitude limiting signal based on the battery level.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, such implementation decisions are not to be interpreted as causing a departure from the scope of the present disclosure.

The steps of a method or algorithm described in connection with the implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A device comprising:
a memory; and
one or more processors coupled to the memory, the one or more processors configured to:
receive first data associated with a first power amplifier and second data associated with a second power amplifier;
generate a first amplitude limiting signal having gain parameters that are based on the first data and the second data, the first data comprising at least one of a temperature measurement associated with the first power amplifier, a supply voltage measurement associated with the first power amplifier, a load resistance associated with the first power amplifier, or a gain associated with the first power amplifier;
modify an audio signal based at least in part on the first amplitude limiting signal to generate a first gain-adjusted audio signal; and
provide a first output audio signal to the first power amplifier for amplification, the first output audio signal based at least in part on the first gain-adjusted audio signal.

2. The device of claim 1, wherein the one or more processors are further configured to:
perform a table look-up operation based on at least one of the temperature measurement, the supply voltage measurement, or the load resistance to determine a target gain; and
determine a difference between the gain associated with the first power amplifier and the target gain, wherein the gain parameters of the first amplitude limiting signal are based on the difference.

3. The device of claim 1, wherein the one or more processors are further configured to:
perform a smoothing operation on the gain parameters of the first amplitude limiting signal to generate a smoothed amplitude limiting signal having smoothed gain parameters; and
apply the smoothed amplitude limiting signal to the audio signal to generate the first gain-adjusted audio signal.

4. The device of claim 1, wherein the load resistance associated with the first power amplifier corresponds to a load resistance of a speaker coupled to an output of the first power amplifier.

5. The device of claim 1, wherein the one or more processors are further configured to:
generate a second amplitude limiting signal having second gain parameters that are based on the second data, the second data comprising at least one of a second temperature measurement associated with the second power amplifier, a second supply voltage measurement associated with the second power amplifier, a second load resistance associated with the second power amplifier, or a second gain associated with the second power amplifier;
modify the audio signal based at least in part on the second amplitude limiting signal to generate a second gain-adjusted audio signal; and provide a second output audio signal to the second power amplifier for amplification, the second output audio signal based at least in part on the second gain-adjusted audio signal.

6. The device of claim 5, wherein the one or more processors are integrated into a mobile device and further configured to:
determine a battery level associated with the mobile device; and
adjust at least one of the first amplitude limiting signal or the second amplitude limiting signal based on the battery level.

7. The device of claim 5, further comprising:
a first peripheral device, wherein the first power amplifier is integrated into the first peripheral device; and
a second peripheral device, wherein the second power amplifier is integrated into the second peripheral device.

8. The device of claim 7, wherein the first peripheral device comprises a speaker, and wherein the second peripheral device comprises a second speaker or a haptic device.

9. The device of claim 1, wherein the one or more processors are further configured to perform an analog-to-digital conversion operation on the first gain-adjusted audio signal to generate the first output audio signal.

10. The device of claim 1, wherein the one or more processors are further configured to:
receive a voltage measurement associated with an amplified signal of the first power amplifier;
receive a current measurement associated with the amplified signal of the first power amplifier; and
determine the load resistance associated with the first power amplifier based on the voltage measurement and the current measurement.

11. A method of managing power amplifiers, the method comprising:
receiving, at a processor, first data associated with a first power amplifier and second data associated with a second power amplifier;
generating, at the processor, a first amplitude limiting signal having gain parameters that are based on the first data and the second data, the first data comprising at least one of a temperature measurement associated with the first power amplifier, a supply voltage measurement associated with the first power amplifier, a load resistance associated with the first power amplifier, or a gain associated with the first power amplifier;
modifying, at the processor, an audio signal based at least in part on the first amplitude limiting signal to generate a first gain-adjusted audio signal; and
providing a first output audio signal to the first power amplifier for amplification, the first output audio signal based at least in part on the first gain-adjusted audio signal.

12. The method of claim 11, further comprising:
performing a table look-up operation based on at least one of the temperature measurement, the supply voltage measurement, or the load resistance to determine a target gain; and
determining a difference between the gain associated with the first power amplifier and the target gain, wherein the gain parameters of the first amplitude limiting signal are based on the difference.

13. The method of claim 11, further comprising:
performing a smoothing operation on the gain parameters of the first amplitude limiting signal to generate a smoothed amplitude limiting signal having smoothed gain parameters, wherein modifying the audio signal based at least in part on the first amplitude limiting signal comprises:
applying the smoothed amplitude limiting signal to the audio signal to generate the first gain-adjusted audio signal.

14. The method of claim 11, wherein the load resistance associated with the first power amplifier corresponds to a load resistance of a speaker coupled to an output of the first power amplifier, a load resistance of a haptic oscillator coupled to the output of the first power amplifier, or a load resistance of a peripheral acoustic device coupled to the output of the first power amplifier.

15. The method of claim 11, further comprising:
generating a second amplitude limiting signal having second gain parameters that are based on the second data, the second data comprising at least one of a second temperature measurement associated with a second power amplifier, a second supply voltage measurement associated with the second power amplifier, a second load resistance associated with the second power amplifier, or a second gain associated with the second power amplifier;
modifying the audio signal based at least in part on the second amplitude limiting signal to generate a second gain-adjusted audio signal; and
providing a second output audio signal to the second power amplifier for amplification, the second output audio signal based at least in part on the second gain-adjusted audio signal.

16. The method of claim 15, further comprising:
determining a battery level associated with a mobile device; and
adjusting at least one of the first amplitude limiting signal or the second amplitude limiting signal based on the battery level.

17. The method of claim 15, wherein the first power amplifier is integrated into a first peripheral device to the processor, and wherein the second power amplifier is integrated into a second peripheral device to the processor.

18. The method of claim 17, wherein the first peripheral device comprises a speaker, and wherein the second peripheral device comprises a second speaker, a haptic device, or a peripheral acoustic device.

19. The method of claim 11, further comprising performing an analog-to-digital conversion operation on the first gain-adjusted audio signal to generate the first output audio signal.

20. The method of claim 11, further comprising:
receiving a voltage measurement associated with an amplified signal of the first power amplifier;
receiving a current measurement associated with the amplified signal of the first power amplifier; and
determining the load resistance associated with the first power amplifier based on the voltage measurement and the current measurement.

21. An apparatus comprising:
means for receiving first data associated with a first power amplifier and second data associated with a second power amplifier;
means for generating a first amplitude limiting signal having gain parameters that are based on the first data and the second data, the first data comprising at least one of a temperature measurement associated with a first power amplifier, a supply voltage measurement, a load resistance associated with the first power amplifier, or a gain associated with the first power amplifier;

means for modifying an audio signal based at least in part on the first amplitude limiting signal to generate a first gain-adjusted audio signal; and means for providing a first output audio signal to the first power amplifier for amplification, the first output audio signal based at least in part on the first gain-adjusted audio signal.

22. The apparatus of claim 21, further comprising:

means for performing a table look-up operation based on at least one of the temperature measurement, the supply voltage measurement, or the load resistance to determine a target gain; and means for determining a difference between the gain associated with the first power amplifier and the target gain, wherein the gain parameters of the first amplitude limiting signal are based on the difference.

23. The apparatus of claim 21, further comprising:

means for performing a smoothing operation on the gain parameters of the first amplitude limiting signal to generate a smoothed amplitude limiting signal having smoothed gain parameters; and means for applying the smoothed amplitude limiting signal to the audio signal to generate the first gain-adjusted audio signal.

* * * * *